US 10,993,357 B2

(12) United States Patent
Taniguchi

(10) Patent No.: US 10,993,357 B2
(45) Date of Patent: Apr. 27, 2021

(54) COMPONENT MOUNTER, REEL HOLDING DEVICE

(71) Applicant: YAMAHA HATSUDOKI KABUSHIKI KAISHA, Shizuoka (JP)

(72) Inventor: Yuzuru Taniguchi, Shizuoka (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 328 days.

(21) Appl. No.: 15/766,762

(22) PCT Filed: Oct. 9, 2015

(86) PCT No.: PCT/JP2015/078799
§ 371 (c)(1),
(2) Date: Apr. 6, 2018

(87) PCT Pub. No.: WO2017/061043
PCT Pub. Date: Apr. 13, 2017

(65) Prior Publication Data
US 2018/0303014 A1   Oct. 18, 2018

(51) Int. Cl.
*H05K 13/02*   (2006.01)
*H05K 13/04*   (2006.01)
*H05K 13/08*   (2006.01)

(52) U.S. Cl.
CPC .......... *H05K 13/021* (2013.01); *H05K 13/04* (2013.01); *H05K 13/0419* (2018.08); *H05K 13/08* (2013.01)

(58) Field of Classification Search
CPC .. H05K 13/021; H05K 13/04; H05K 13/0419; H05K 13/08
See application file for complete search history.

(56) References Cited

U.S. PATENT DOCUMENTS

| 5,598,986 A * | 2/1997 | Ando | H05K 13/0419 |
| | | | 242/597.6 |
| 7,220,095 B2 * | 5/2007 | Lyndaker | H05K 13/0419 |
| | | | 414/810 |

(Continued)

FOREIGN PATENT DOCUMENTS

| JP | 2004-228207 A | 8/2004 |
| JP | 2010-147223 A | 7/2010 |

(Continued)

OTHER PUBLICATIONS

An Office Action issued by the Chinese Patent Office dated Jun. 14, 2019, which corresponds to Chinese Patent Application No. 201580083553.0 and is related to U.S. Appl. No. 15/766,762; with English language translation.

(Continued)

*Primary Examiner* — Minh N Trinh
(74) *Attorney, Agent, or Firm* — Studebaker & Brackett PC

(57) ABSTRACT

A component mounter comprises a reel holder that holds a reel on which a carrier tape accommodating components is wound, a tape supplier that feeds the carrier tape withdrawn from the reel held by the reel holder to a predetermined component supplying position, and a mounting head that performs component mounting of removing the component from the carrier tape and mounting the component on a board. The reel holder includes a first reel support that supports the reel when component mounting is performed, a second reel support that supports a reel on which the carrier tape to be withdrawn by the tape supplier when a next component mounting is performed, and a reel guide that guides the reel moving from the second to first reel support by receiving a force acting toward the first reel support when (Continued)

the force acts on the reel supported on the second reel support.

16 Claims, 18 Drawing Sheets

(56) References Cited

U.S. PATENT DOCUMENTS

| | | | | |
|---|---|---|---|---|
| 9,137,936 | B2* | 9/2015 | Katsumi | H05K 13/0417 |
| 2015/0115093 | A1* | 4/2015 | Tanokuchi | H05K 13/021 |
| | | | | 242/560.1 |
| 2018/0303014 | A1* | 10/2018 | Taniguchi | H05K 13/021 |

FOREIGN PATENT DOCUMENTS

| | | |
|---|---|---|
| JP | 2014-011315 A | 1/2014 |
| WO | 2015/088449 A1 | 6/2015 |

OTHER PUBLICATIONS

International Search Report issued in PCT/JP2015/078799; dated Dec. 15, 2015.

\* cited by examiner

COMPONENT MOUNTER, REEL HOLDING DEVICE

CROSS-REFERENCE TO RELATED APPLICATION

This application is a National Stage of International Patent Application No. PCT/JP2015/078799, filed Oct. 9, 2015, the entire content of which is incorporated herein by reference.

BACKGROUND

Technical Field

This disclosure relates to a technique for holding a reel having a carrier tape accommodating components wound on an axle.

Background Art

Conventionally, a component mounter is used which supplies components to a predetermined component supplying position by feeding a carrier tape accommodating the components by a tape feeder and mounts a component taken out at the component supplying position on a board by a mounting head. Such a component mounter includes a reel holder for holding the reel having the carrier tape wound thereon, and the tape feeder feeds the carrier tape withdrawn from the reel in the reel holder to the component supplying position and uses the carrier tape for component mounting being performed. Particularly, a component mounter described in JP2004-228207 stocks an auxiliary reel used when a carrier tape on a reel held by a reel holder is used up in a reel stock part below the reel holder.

SUMMARY

In the above component mounter, if the carrier tape on the reel held by the reel holder is used up, an operator appropriately performs an operation of taking out the auxiliary reel from the reel stock part below the reel holder and setting the auxiliary reel in the reel holder. Accordingly, a technique capable of reducing a burden of the operator required to move the reel has been desired.

This disclosure was developed in view of the above problem and aims to provide a technique capable of reducing a burden of an operator required to move a reel to be used next.

A component mounter according to the disclosure comprises a reel holding device configured to hold a reel on which a carrier tape accommodating components is wound, and a tape supplying part configured to feed the carrier tape withdrawn from the reel held by the reel holding device to a predetermined component supplying position. The component mounter further comprises a mounting head configured to perform component mounting of taking out the component supplied to the component supplying position by the tape supplying part from the carrier tape and mounting the component on a board. The reel holding device includes a first reel supporting part configured to support the reel on which the carrier tape, withdrawn by the tape supplying part when a component mounting is being performed, is wound, a second reel supporting part configured to support an other reel on which the carrier tape, planned to be withdrawn by the tape supplying part in a next component mounting, is wound, and a reel guide part configured to guide the other reel moving from the second reel supporting part to the first reel supporting part by receiving a force acting toward the first reel supporting part when the force acts on the other reel supported on the second reel supporting part.

A reel holding device according to the disclosure comprises a first reel supporting part configured to support a reel on which wound is a carrier tape accommodating components used in component mounting of mounting the components on a board and being withdrawn toward a predetermined component supplying position by a tape supplying part when a component mounting is being performed, and a second reel supporting part configured to support an other reel on which wound is a carrier tape accommodating the components and being planned to be withdrawn toward the component supplying position by the tape supplying part in a next component mounting. The reel holding device further comprises a reel guide part configured to guide the other reel moving from the second reel supporting part to the first reel supporting part by receiving a force acting toward the first reel supporting part when the force acts on the other reel supported on the second reel supporting part.

In the disclosure (component mounter, reel holding device) thus configured, the reel used in the component mounting being performed is supported on the first reel supporting part, whereas the other reel used in the next component mounting is supported on the second supporting part. In addition, if a force acting toward the first reel supporting part acts on the reel supported on the second reel supporting part, the reel guide part guides the other reel moving from the second reel supporting part to the first reel supporting part by receiving the force. This force may be given without depending on an operator's hand or may be given by the operator's hand as described later. That is, the operator can move the other reel by a simple operation of pushing the other reel supported on the second reel supporting part toward the first reel supporting part. In this way, a burden of the operator required to move the other reel to be used next can be reduced.

According to the disclosure, it is possible to reduce a burden of an operator required to move a reel to be used next.

DETAILED DESCRIPTION

Figure 1:
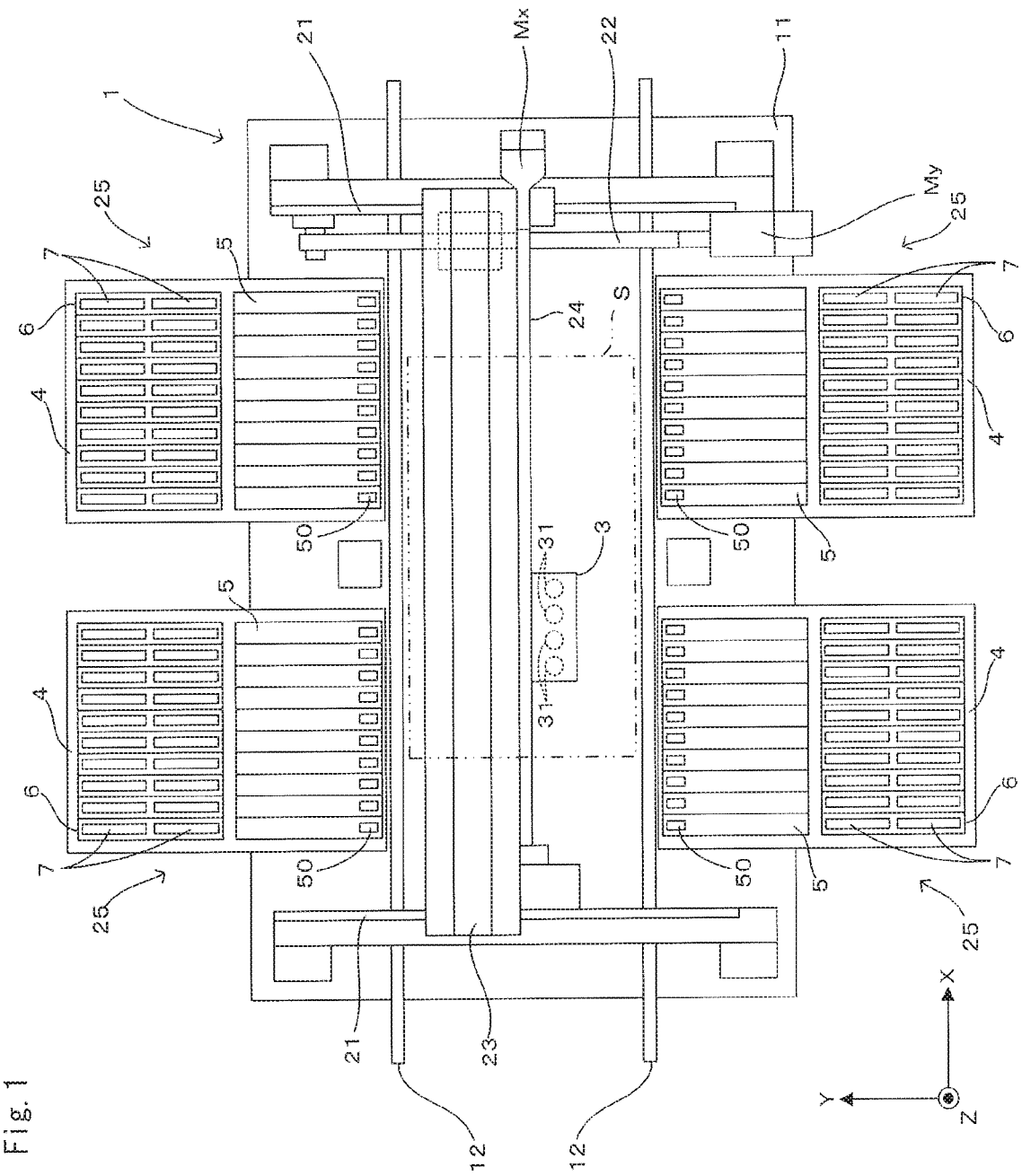
FIG. 1 is a partial plan view schematically showing a component mounter according to the disclosure.

FIG. 1 is a partial plan view schematically showing a component mounter according to the disclosure. In FIG. 1, an XYZ orthogonal coordinate system with a Z direction parallel to a vertical direction and X and Y direction respectively parallel to a horizontal direction is shown. This component mounter 1 includes a pair of conveyors 12, 12 provided on a base 11. The component mounter 1 mounts a component on a board S carried to a work position (position of the board S of FIG. 1) from an upstream side in the X direction (board conveying direction) by the conveyors 12 and carries out the board S completed with component mounting from the work position to a downstream side in the X direction by the conveyors 12.

The component mounter 1 is provided with a pair of Y-axis rails 21, 21 extending in the Y direction, a Y-axis ball screw 22 extending in the Y direction and a Y-axis motor My configured to rotationally drive the Y-axis ball screw 22, and a head supporting member 23 is fixed to a nut of the Y-axis ball screw 22 while being supported on the pair of Y-axis rails 21, 21 movably in the Y direction. An X-axis ball screw 24 extending in the X direction and an X-axis motor Mx configured to rotationally drive the X-axis ball screw 24 are attached to the head supporting member 23, and a head unit 3 is fixed to a nut of the X-axis ball screw 24 while being supported on the head supporting member 23 movably in the X direction. Thus, the head unit 3 can be moved in the Y direction by rotating the Y-axis ball screw 22 by the Y-axis motor My or can be moved in the X direction by rotating the X-axis ball screw 24 by the X-axis motor Mx.

Two component supplying units 25 are arranged in the X direction on each of both sides of the pair of conveyors 12, 12 in the Y direction, and a feeder mounting carriage 4 is removably attached to each component supplying unit 25. A plurality of tape feeders 5 arranged in the X direction and a plurality of reel holders 6 arranged in the X direction are removably attached to this feeder mounting carriage 4, one tape feeder 5 and one reel holder 6 are arranged in the Y direction while being associated with each other.

A carrier tape TP accommodating small-piece components (chip electronic components) such as integrated circuits, transistors and capacitors at predetermined intervals is wound on a reel 7 held by each reel holder 6. This carrier tape TP is a conventionally known embossed tape and configured such that components accommodated in each of a plurality of pockets aligned in a row at equal intervals are covered with a cover. Further, a plurality of engagement holes aligned at fixed intervals along an edge penetrate through one side of the carrier tape TP. As described later, two carrier tapes TP can be attached to each tape feeder 5. Corresponding to this, each reel holder 6 holds two reels 7 arranged in the Y direction. Each tape feeder 5 supplies the components in the carrier tape TP to a predetermined component supplying position 50 by intermittently feeding the carrier tape TP withdrawn from the reel 7 in the reel holders 6 adjacent in the Y direction toward the head unit 3.

The head unit 3 includes a plurality of (four) mounting heads 31 arranged in the X direction. Each mounting head 4 has an elongated shape extending in the Z direction (vertical direction) and can suck and hold the component by a nozzle disengageably attached to the lower end thereof. That is, the mounting head 31 moves to a position above the tape feeder 4 and suck the component supplied by the tape feeder 4. Subsequently, the mounting head 31 moves to a position above the board S at the work position and mounts the component on the board S by releasing the suction of the component. In this way, the mounting head 31 performs component mounting of taking out the component supplied to the component supplying position 50 by the tape feeder 5 from the carrier tape TP and mounting the component on the board S.

Figure 2:
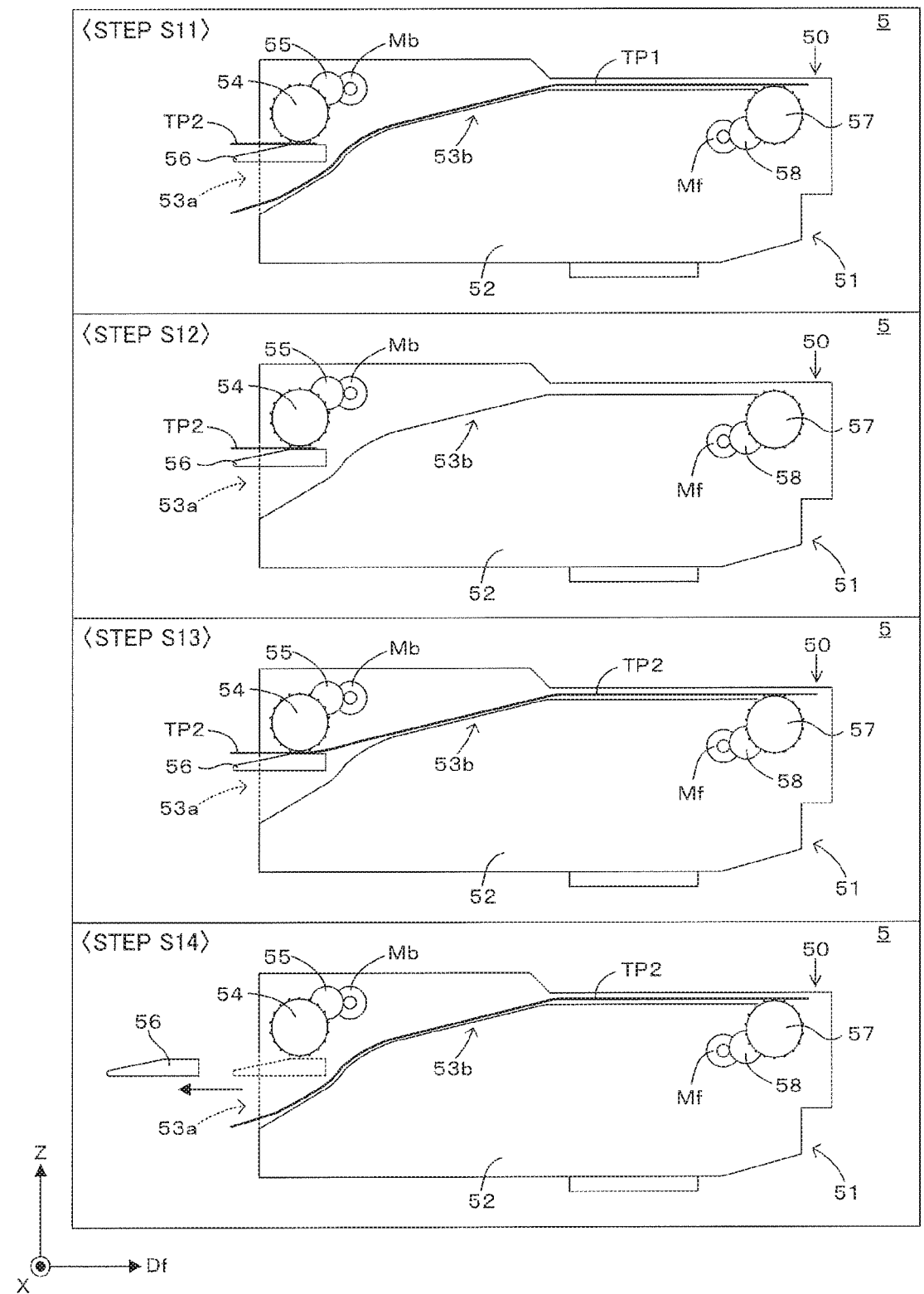
FIG. 2 is side views schematically showing an example of the configuration and operation of the tape feeder.

FIG. 2 is side views schematically showing an example of the configuration and operation of the tape feeder. In FIG. 2 and subsequent figures, a feed direction Df (parallel to the Y direction) in which the tape feeder 5 feeds the carrier tape TP is shown as appropriate, an arrow side of the feed direction Df is referred to as a "front side" of the feed direction Df and a side opposite to the arrow of the feed direction Df is referred to as a "back side" of the feed direction Df. Further, to distinguish the two carrier tapes TP mountable in the tape feeder 5, different reference signs TP1, TP2 are appropriately used for the carrier tapes in FIG. 2 and subsequent figure.

The tape feeder 5 includes a feeder main body 51, which is a mechanical configuration, and motors Mf, Mb configured to drive the feeder main body 51. The feeder main body 51 includes a flat case 52 thin in the X direction and long in the feed direction Df. An insertion opening 53a (shown by dotted line) extending in the Z direction is open in the back end of the case 52 in the feed direction Df, and the aforementioned component supplying position 50 is provided on the upper surface of a front part of the case 51 in the feed direction Df. A tape conveying path 53b from the insertion opening 53a to the component supplying position 50 is provided in the feeder main body 51. This feeder main body 51 supplies the component to the component supplying position 50 by feeding the carrier tape TP inserted into the tape conveying path 53b through the insertion opening 53a in the feed direction Df by receiving drive forces of the motors Mf, Mb.

Specifically, the feeder main body 51 includes, in the case 52, a sprocket 54 arranged adjacent to the insertion opening 53a above the tape conveying path 53b and a gear 55 configured to transmit the drive force of the motor Mb to the sprocket 54, and the sprocket 54 rotates by receiving the drive force generated by the motor Mb. Further, the feeder main body 51 includes a tape supporting member 56 removably attached to the case 52. This tape supporting member 56 faces the sprocket 54 from below and causes the carrier tape TP to engage the sprocket 54 by sandwiching the carrier tape TP between the tape supporting member 56 and the sprocket 54. In this way, the sprocket 54 can feed the carrier tape TP in the feed direction Df by rotating while being engaged with the carrier tape TP. Further, the feeder main body 51 includes, in the case 52, a sprocket 57 arranged in a front end part thereof and adjacent to the tape conveying path 53b from below and a gear 58 configured to transmit the drive force of the mot Mf to the sprocket 57, and the sprocket 57 rotates by receiving the drive force generated by the motor Mf. Thus, the sprocket 57 can intermittently convey the carrier tape TP in the feed direction Df by intermittently rotating while being engaged with the carrier tape TP.

Step S11 corresponds to a state while the mounting head 31 is performing component mounting. That is, the carrier tape TP1 is inserted into the feeder main body 51 along the tape conveying path 53b, and the sprocket 57 supplies the component to the component supplying position 50 by intermittently conveying the carrier tape TP1 in the feed direction Df. Then, the mounting head 31 mounts the component supplied to the component supplying position 50 on the board S. Further, in Step S11, the tip of the carrier tape TP2 used for component mounting next to the carrier tape TP1 is mounted between the sprocket 54 and the tape supporting member 56. In this way, the carrier tape TP2 to be used next waits in a rear end part of the feeder main body 51.

As shown in Step S12, when the components in the carrier tape TP1 are used up and the tape feeder 5 discharges the carrier tape TP1, loading shown in Step 13 is performed. Specifically, the sprocket 54 starts rotating to feed the carrier tape TP2 toward the component supplying position 50 in the feed direction Df and the tip of the carrier tape TP2 is engaged with the sprocket 57. Subsequently, when the operator performs an operation of removing the tape supporting member 56 from the case 52 in Step S14, the carrier tape TP2 is detached from the sprocket 54 and drops onto the tape conveying path 53b. This enables the sprocket 57 to intermittently convey the carrier tape TP2 in the feed direction Df and supply the component in the carrier tape TP2 to the component supplying position 50. Incidentally, the operator can mount a carrier tape TP to be used for component mounting next to the carrier tape TP2 between the sprocket 54 and the tape supporting member 56 and cause the carrier tape TP to wait by mounting the tape supporting member 56 in the case 52 again after Step S14.

In the component mounter 1 using such a tape feeder 5, the carrier tape TP to be used in the component mounting being performed is inserted into the feeder main body 51 along the tape conveying path 53b, whereas the carrier tape TP used for the next component mounting waits above the tape conveying path 53b. By performing Steps S12 to S14 every time the carrier tape TP is used up, the waiting carrier tape TP can be inserted into the feeder main body 51 along the tape conveying path 53b and used for the next component mounting.

Figure 3:
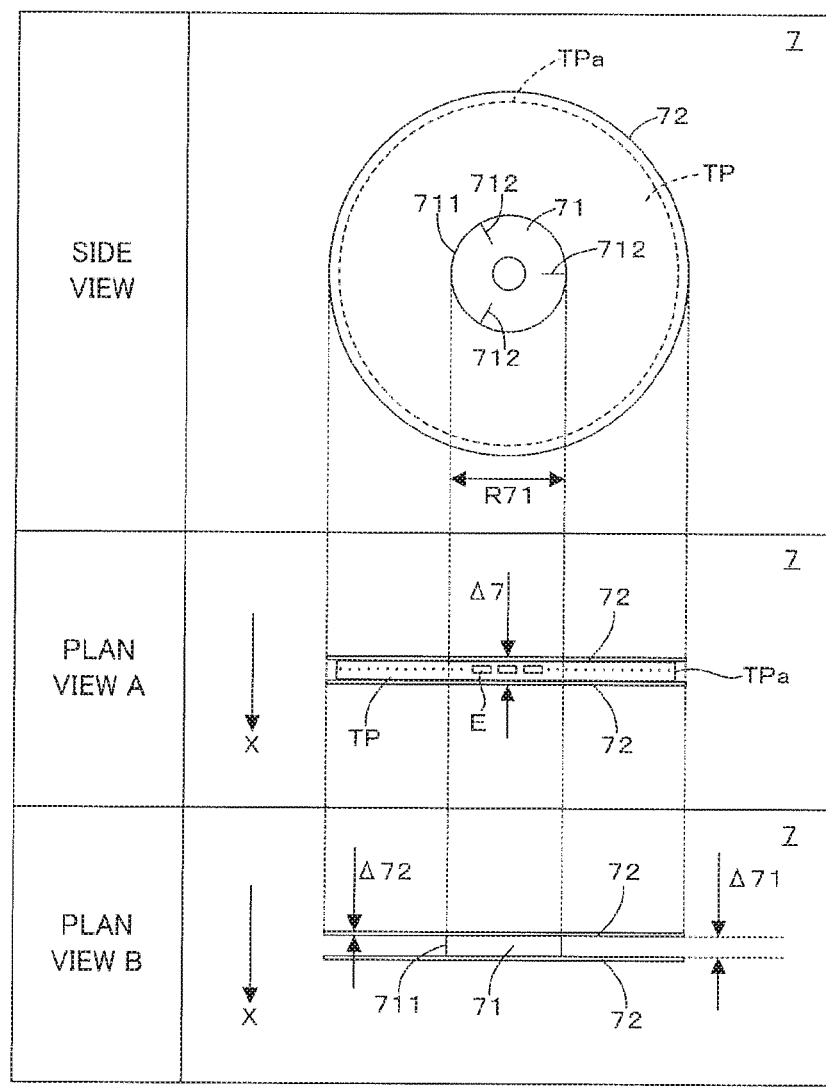
FIG. 3 is views schematically showing an example of the configuration of the reel holding the carrier tape.

FIG. 3 is views schematically showing an example of the configuration of the reel holding the carrier tape, wherein a side view and a plan view of the reel having the carrier tape wound thereon are shown in "Side View" and "Plan View A" of FIG. 3 and a plan view of the reel having no carrier tape is shown in "Plan View B" of FIG. 3. The reel 7 includes an axle 71 and two side plates 72 sandwiching the axle 71 from both sides, and has a maximum thickness Δ7 in the X direction. The axle 71 has such a shape that a plurality of slits 712 are provided in a cylindrical peripheral surface 711 having a diameter R71. The plurality of slits 712 are respectively provided to extend toward a center from the peripheral surface 711 of the axle 71, and arranged at equal intervals in a circumferential direction of the axle 71. The carrier tape TP accommodating a plurality of components E are wound on the axle 71 with the tip thereof engaged with one slit 712. Further, the respective side plates 72 have a disc shape having a thickness Δ72 and are provided concentrically with the axle 71 while being spaced in the X direction by an interval Δ71. By sandwiching the carrier tape TP wound on the axle 71 from both sides by the two side plates 72 in this way, lateral detachment of the carrier tape TP from the axle 71 is restrained. Further, an outermost part TPa of the carrier tape TP is located inwardly of the peripheral edges of the respective side plates 72 with the carrier tape TP fully wound on the reel 7. Note that various materials are assumed for the reel 7 and, for example, the reel 7 can be formed of paper, plastic material or the like.

Figure 4:
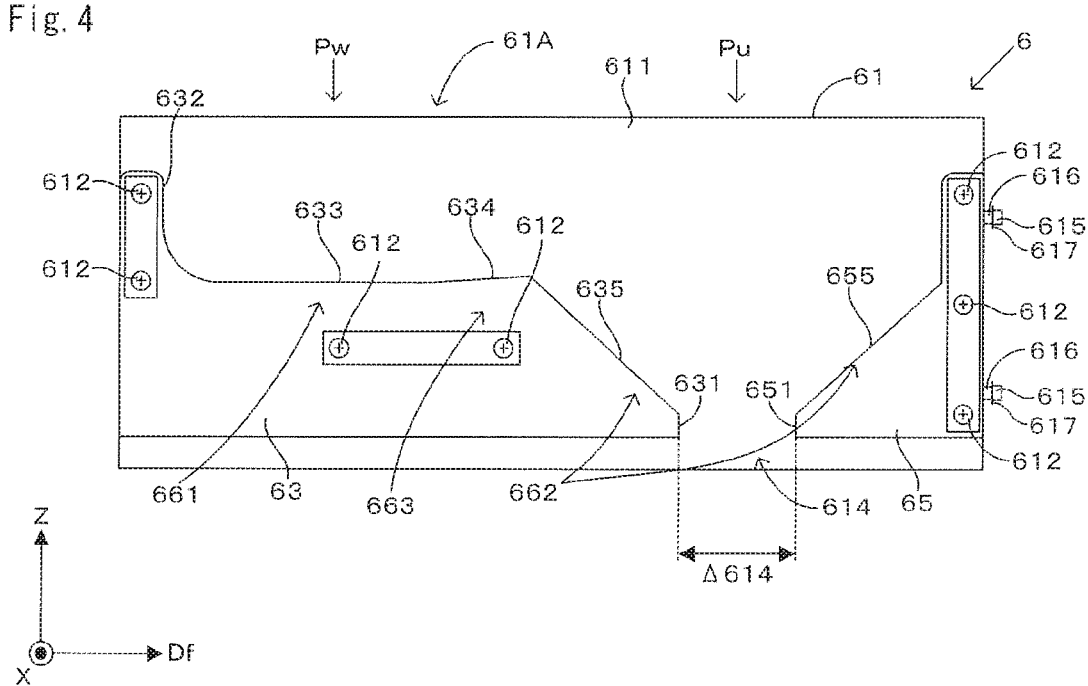
FIG. 4 is a side view schematically showing an example of the configuration of the reel holder with the reel removed.
Figure 5:
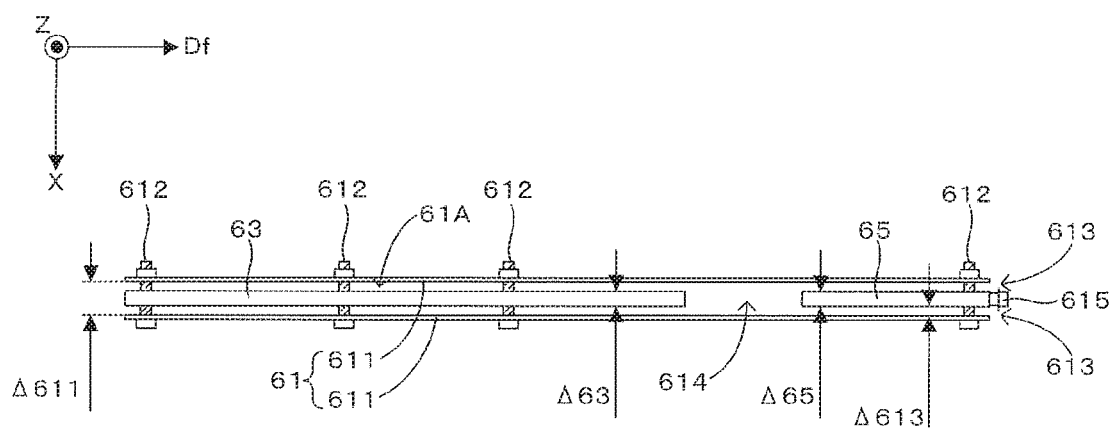
FIG. 5 is a plan view schematically showing the example of the configuration of the reel holder with the reel removed.
Figure 6:
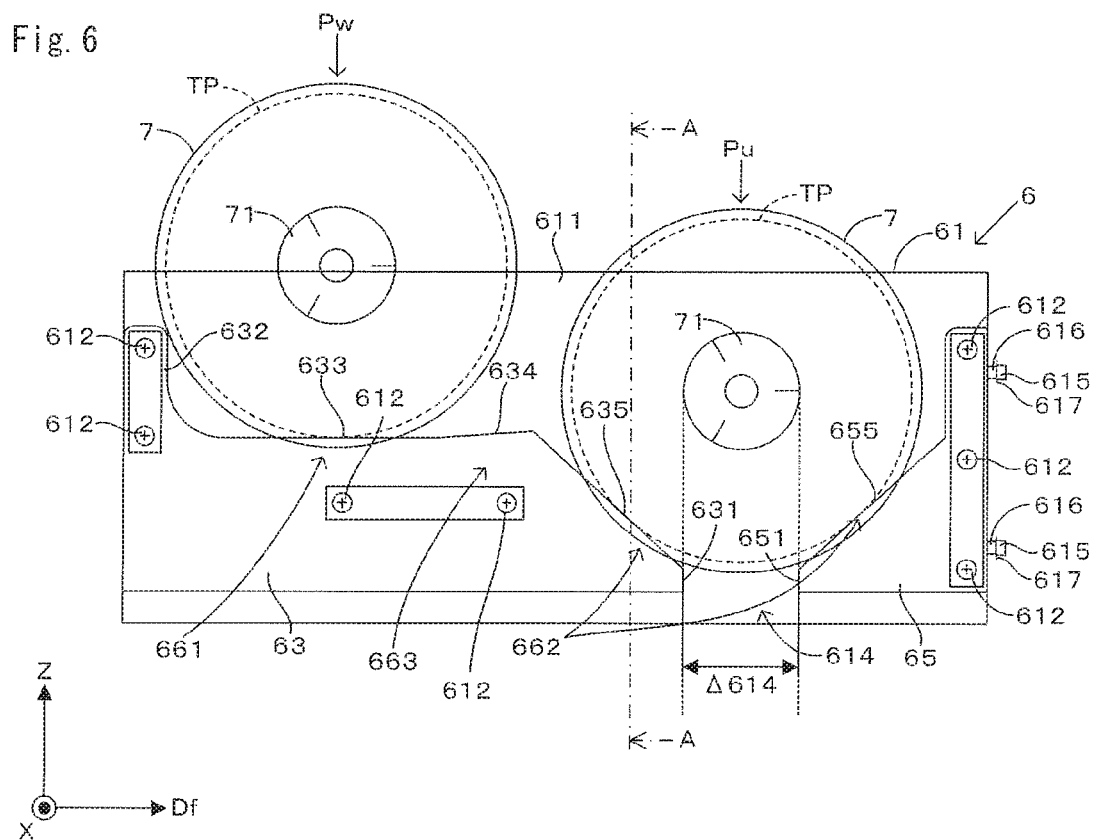
FIG. 6 is a side view schematically showing an example of the configuration of the reel holder with the reel set.
Figure 7:
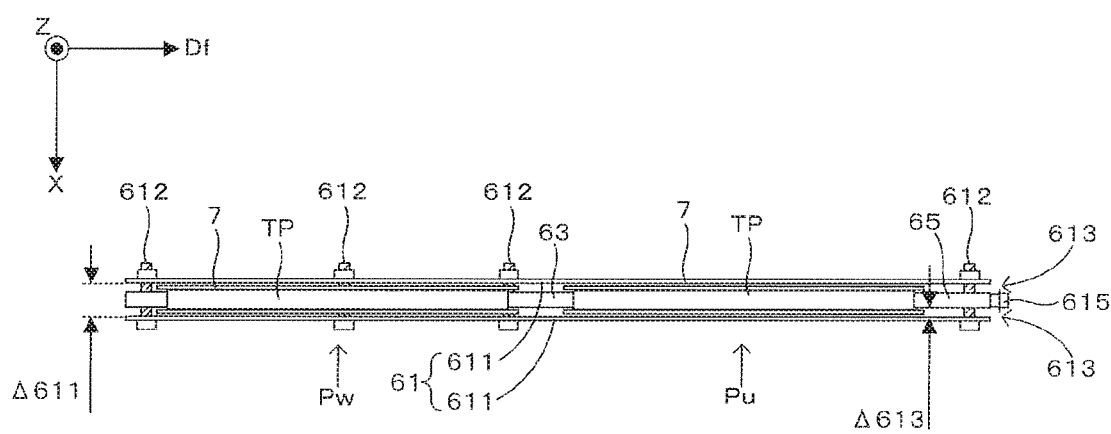
FIG. 7 is a plan view schematically showing the example of the configuration of the reel holder with the reel set.
Figure 8:
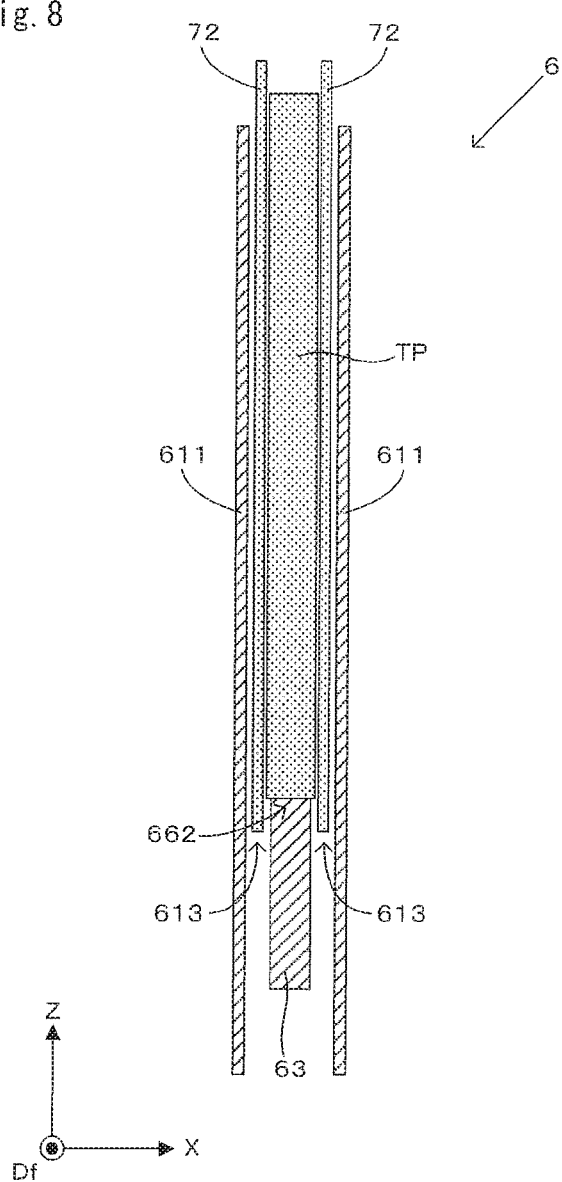
FIG. 8 is a sectional view along A-A of FIG. 6.

FIG. 4 is a side view schematically showing an example of the configuration of the reel holder with the reel removed. FIG. 5 is a plan view schematically showing the example of the configuration of the reel holder with the reel removed. FIG. 6 is a side view schematically showing an example of the configuration of the reel holder with the reel set. FIG. 7 is a plan view schematically showing the example of the configuration of the reel holder with the reel set. Further, FIG. 8 is a sectional view along A-A of FIG. 6. Note that, in FIGS. 4 and 6, the inside of the reel holder 6 is shown through a side cover 611 on a front side.

A body 61 of the reel holder 6 includes two side covers 611 spaced apart in the X direction and fastening instruments 612 which have nuts and bolts and be configured to fix the two side covers 611 to each other, and an opening 61A is open upward between the two side covers 611. An interval Δ611 between the two side covers 611 is slightly larger than the thickness Δ7 of the reel 7 and the reel 7 inserted through the opening 61A can be accommodated between these side covers 611. Further, the reel holder 6 includes two reel supporting structure 63, 65 arranged in the feed direction Df in the body 61. These reel supporting structures 63, 65 are fixed to the side covers 611 by the fastening instruments 612 while being sandwiched by the two side covers 611 in the X direction. Note that each fastening instrument 612 is arranged outside a passage range of the reel 7 moving from a standby position Pw to a use position Pu to be described later and a passage range of the reel 7 discharged from the use position Pu.

The respective reel supporting structures 63, 65 have the same thicknesses Δ63, Δ65 slightly smaller than the interval Δ71 between the two side plates 72 of the reel 7. Further, clearances 613 are defined in the X direction between the reel supporting structures 63, 65 and the respective side covers 611, and each clearance 613 has a thickness Δ613 slightly larger than the thickness Δ72 of the side plates 72 of the reel 7 in the X direction. Thus, as shown in FIGS. 6, 7 and 8, the reel supporting structure 63, 65 can be brought into contact with the carrier tape TP from below in a state where the reel supporting structure 63, 65 is fitted between the two side plates 72 of the reel 7 while the respective side plates 72 of the reel 7 are fitted in the respective clearances 613. That is, the reel supporting structure 63, 65 can support the axle 71 of the reel 7 against gravity by coming into contact with the carrier tape TP wound on the axle 71 of the reel 7. In this way, the upper ends of the reel supporting structures 63, 65 function as rails configured to support or guide the reel 7 while being fitted into the reel.

These reel supporting structures 63, 65 are spaced apart in the feed direction Df, and a space between the reel supporting structures 63, 65 functions as a discharge opening 614 configured to discharge the axle 71 of the reel 7 having the carrier tape TP used up. That is, a width Δ614 of the discharge opening 614 is equal to or slightly larger than the diameter R71 of the axle 71 of the reel 7 in the feed direction Df and the axle 71 of the reel 7 can exit through the discharge opening 614 in the Z direction. Further, side ends of the respective reel supporting structures 63, 65 adjacent to the discharge opening 614 in the feed direction Df, i.e. a front end 631 of the reel supporting structure 63 and a back end 651 of the reel supporting structure 65 are parallel to the Z direction, so that the axle 71 of the reel 7 can smoothly exit through the discharge opening 614. Note that the width Δ614 of the discharge opening 614 in the feed direction Df is smaller than a roll diameter of the carrier tape TP wound only one turn on the axle 71 to suppress the exit of the axle 71 through the discharge opening 614 in a state where the carrier tape TP remains.

Such reel supporting structures 63, 65 can support the reel 7 at each of the use position Pu facing the discharge opening 614 from above and the standby position Pw behind the use positon Pu in the feed direction Df. That is, a rear end part of the reel supporting structure 63 constitutes a standby reel supporting part 661 configured to support the reel 7 located at the standby position Pw, a front end part of the reel supporting structure 63 and the reel supporting structure 65 constitute a use reel supporting part 662 configured to support the reel 7 located at the use position Pu, and a central part of the reel supporting structure 63 between the standby reel supporting part 661 and the use reel supporting part 662 constitutes a reel guide part 663 configured to guide a movement of the reel 7 from the standby reel supporting part 661 to the use reel supporting part 662. The detailed configurations of the reel supporting structures 63, 65 are as follows.

The reel supporting structure 63 includes a convex part 632 projecting upward on the back end in the feed direction Df to prevent the reel 7 located at the standby reel Pw from jumping out backward in the feed direction Df. Further, the reel supporting structure 63 includes an extended part 633 horizontally extending forward in the feed direction Df from the lower end of the convex part 632. A part of this extended part 633 located right below the axle 71 of the reel 7 at the standby position Pw functions as the standby reel supporting part 661 and supports the reel 7 against gravity by being held in contact with the carrier tape TP wound on the reel 7 at the standby position Pw from below.

Further, the reel supporting structure 63 includes a slope part 634 slightly inclined upwardly as extending forward from the front end of the extended part 633 in the feed direction Df. It is suppressed by the slope part 634 that the reel 7 at the standby position Pw jumps out forward in the feed direction Df due to an external impact or the like. Furthermore, the reel supporting structure 63 includes a slope part 635 inclined downwardly as extending forward from the front end of the slope part 634 in the feed direction Df and reaching the back end of the discharge opening 614. On the other hand, the reel supporting structure 65 includes a slope part 655 inclined upwardly as extending forward from the front end of the discharge opening 614 in the feed direction Df. Out of these slope parts 635, 655, parts held in contact with the carrier tape TP wound on the reel 7 at the use position Pu function as the use reel supporting part 662 and support the reel 7 at the use position Pu against gravity. Further, out of the extended part 633, the slope part 634 and the slope part 635, parts extending from the standby reel supporting part 661 to the use reel supporting part 662 function as the reel guide part 663 and guide a movement of the reel 7 from the standby position Pw to the use position Pu.

Further, two engagement projections 615 are arranged in the Z direction on the front end of the reel supporting structure 65 in the feed direction Df. Each engagement projection 615 includes a cylindrical part 616 projecting forward in the feed direction Df and a flange part 617 protruding from the cylindrical part 616. The reel holder 6 is removably attached to the feeder mounting carriage 4 by the engagement projections 615.

Figure 9:
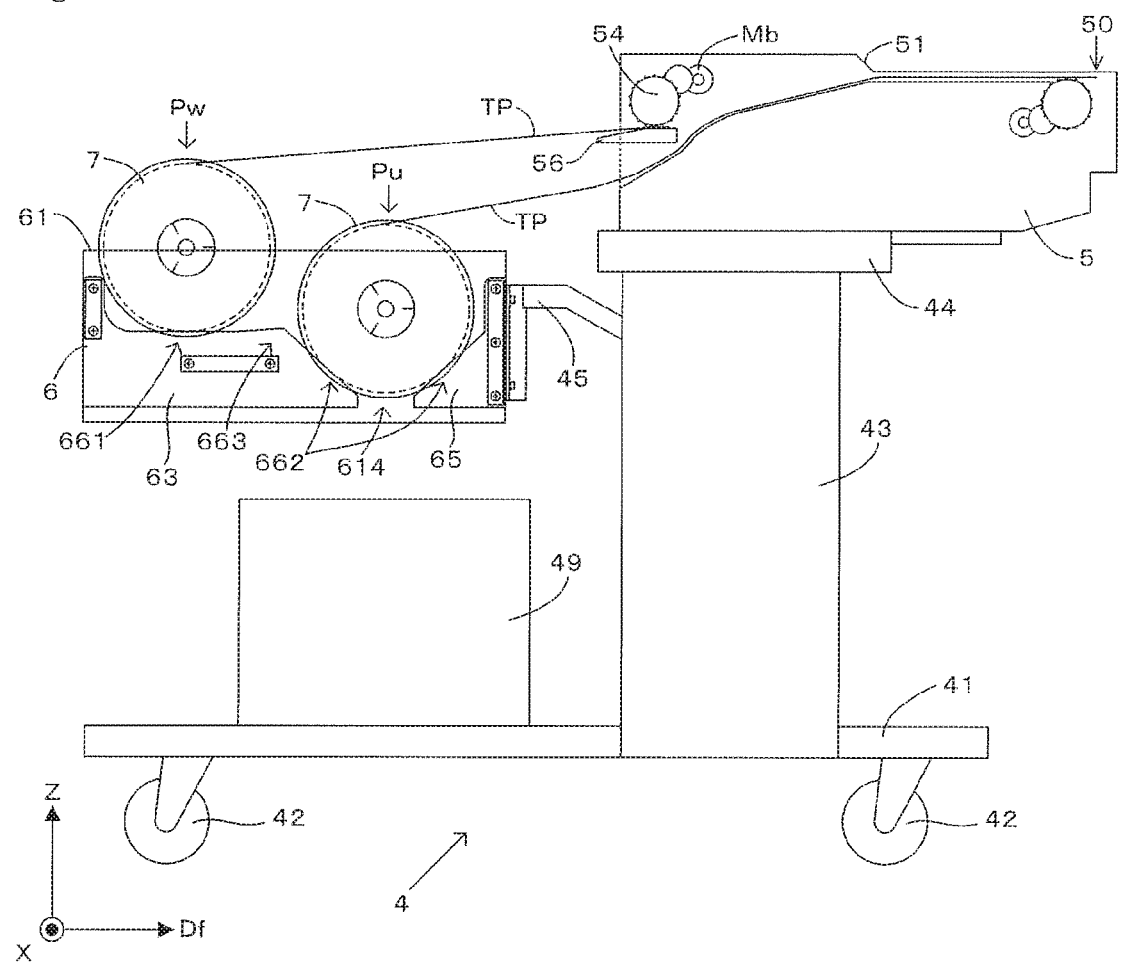
FIG. 9 is a side view schematically showing the feeder mounting carriage having the tape feeders and the reel holders attached thereto.

FIG. 9 is a side view schematically showing the feeder mounting carriage having the tape feeders and the reel holders attached thereto. The feeder mounting carriage 4 includes a horizontally arranged bottom plate 41 and casters 42 configured to support the bottom plate 41 with respect to a ground surface. Further, the feeder mounting carriage 4 includes a supporting frame 43 standing on a front part of the bottom plate 41 in the feed direction Df, a feeder attaching part 44 provided on the upper end of the supporting frame 43 and a reel holder attaching part 45 extending backward in the feed direction Df from the supporting frame 43. The tape feeders 5 are removably attached to the feeder attaching part 44, and the reel holders 6 are removably attached to the rear end of the reel holder attaching part 45. Further, a reel collection container 49 is placed on the bottom plate 41 at a position right below the discharge openings 614 of the reel holders 6 attached to the reel holder attaching part 45, so that the reels 7 discharged from the discharge openings 614 can be collected into the reel collection container 49.

Figure 10:
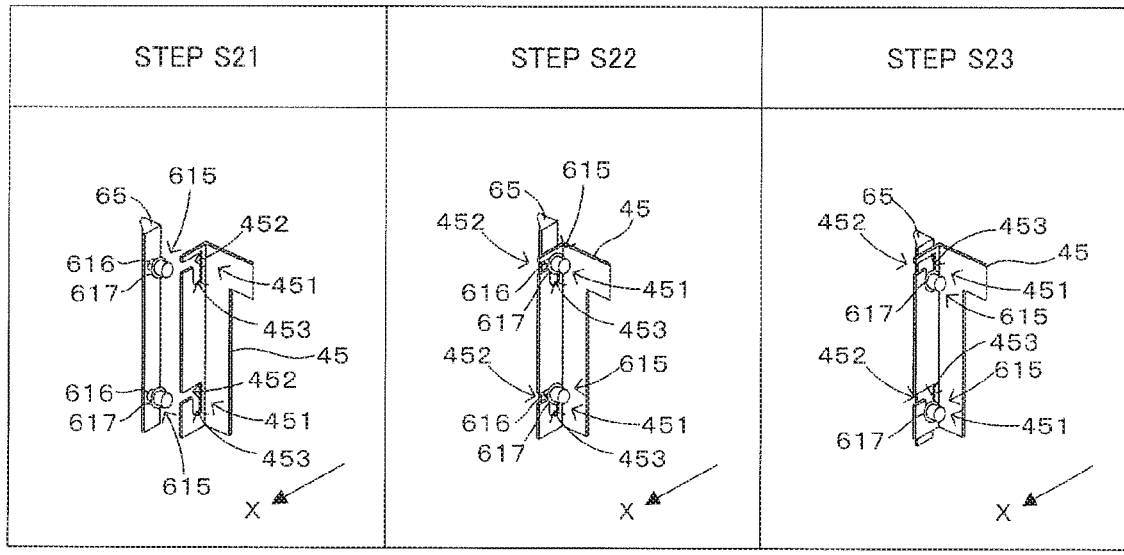
FIG. 10 is perspective views schematically showing an example of an attaching structure of the reel holder and the reel holder attaching part.

FIG. 10 is perspective views schematically showing an example of an attaching structure of the reel holder and the reel holder attaching part. Two engagement holes 451 are arranged at the same interval as that of the two engagement projections 615 in the Z direction on a rear end part of the reel holder attaching part 45. Each engagement hole 451 includes a lead-in part 452 having one end open laterally and extending in the X direction and an engagement part 453 extending downward from the other end of the lead-in part 452, and both the lead-in part 452 and the engagement part 453 have a width wider than the cylindrical part 616 and narrower than the flange part 617 of the engagement projection 615. The cylindrical part 616 of each engagement projection 615 is caused to face the opening of the lead-in part 452 of each engagement hole 451 in the X direction (Step S21), and be inserted into the lead-in part 452 of each engagement hole 451 (Step S22). Further, the cylindrical part 616 of each engagement projection 615 is caused to drop onto the engagement part 453 of each engagement hole 451, whereby the engagement projection 615 and the engagement hole 451 are engaged and the reel holder 6 can be attached to the reel holder attaching part 45 (Step S23). Further, the reel holder 6 can be removed from the reel holder attaching part 45 by performing an operation opposite to that of Steps S21 to S23.

Figure 11:
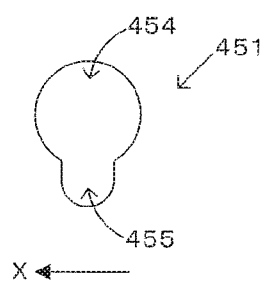
FIG. 11 is a diagram schematically showing a modification of the engagement hole of the reel holder attaching part.

Note that various configurations of such an engagement hole 451 are possible and the engagement hole 451 may be configured as shown in FIG. 11. FIG. 11 is a diagram schematically showing a modification of the engagement hole of the reel holder attaching part. This engagement hole 451 includes a lead-in part 454 wider than the flange part 617 of the engagement projection 615 and an engagement part 455 wider than the cylindrical part 616 and narrower than the flange part 617 of the engagement projection 615. By causing the cylindrical part 616 of the engagement projection 615 to drop onto the engagement part 455 after the engagement projection 615 is inserted into the lead-in part 454 of the engagement hole 451, the engagement projection 615 and the engagement hole 451 can be engaged and the reel holder 6 can be attached to the reel holder attaching part 45.

In the component mounter 1 using such a reel holder 6, the carrier tape TP wound on the reel 7 held at the use position Pu can be used for the component mounting and the reel 7 on which the carried tape TP to be used for the next component mounting is wound can be caused to wait at the standby position Pw. Next, functions of this reel holder 6 are described.

Figure 12:
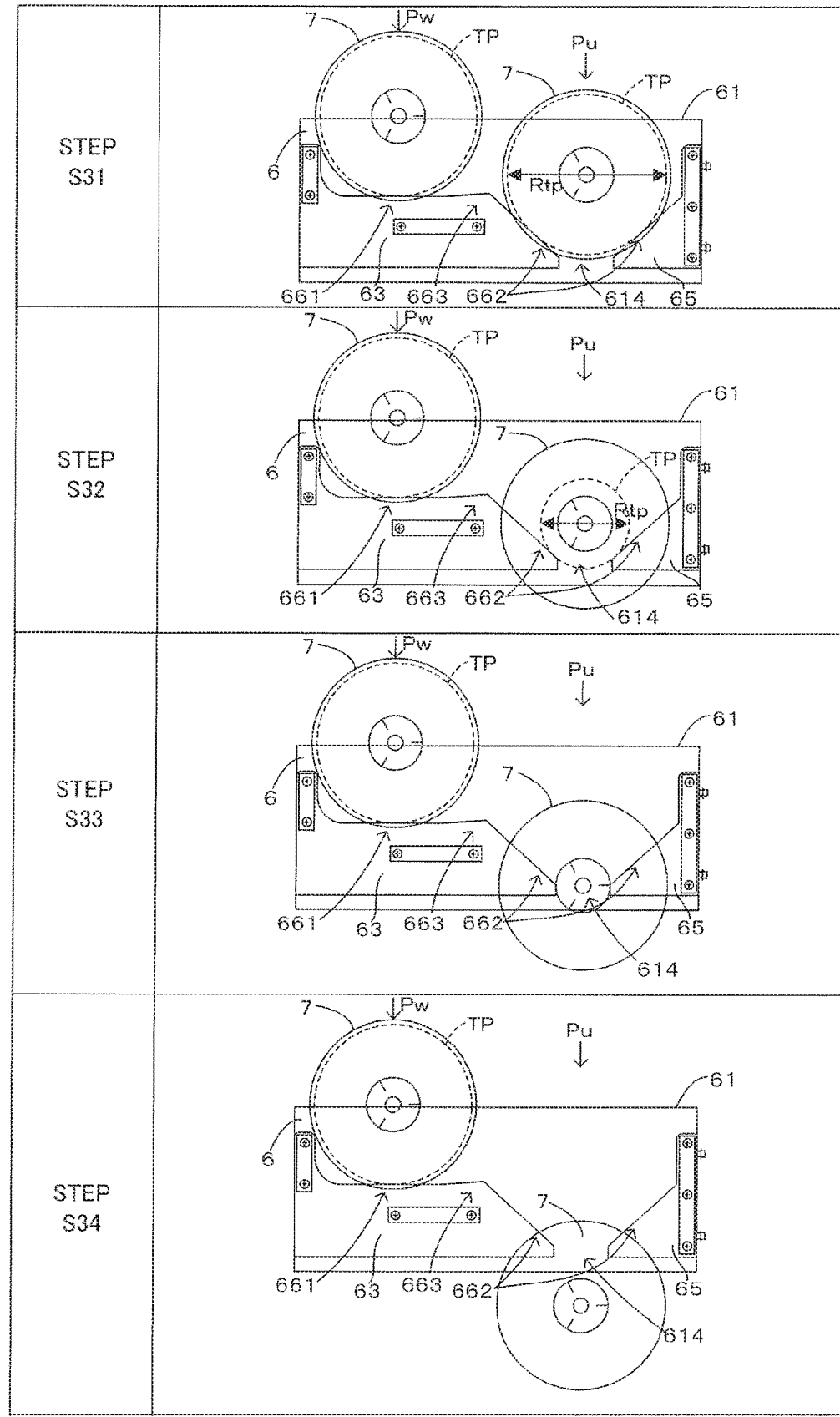
FIG. 12 is side views schematically showing a first example of the function of the reel holder.

FIG. 12 is side views schematically showing a first example of the function of the reel holder. Note that the carrier tape TP withdrawn from the reel 7 and moving toward the tape feeder 5 is not shown in FIG. 12. In Step S31, the reel 7 having the carrier tape TP fully wound thereon is held at each of the use position Pu and the standby position Pw. Particularly, a roll diameter Rtp of the carrier tape TP wound on the reel 7 at the use position Pu is larger than the width Δ614 of the discharge opening 614 in the X direction and the slope parts 635, 655 constituting the use reel supporting part 662 support the axle 71 of the reel 7 by being held in contact with the roll outer periphery of the carrier tape TP.

When the component mounting is started, the carrier tape TP is intermittently withdrawn from the reel 7 held at the use position Pu. Along with this, as shown in a field of Step S32, the roll diameter Rtp of the carrier tape TP wound on the reel 7 held at the use position Pu decreases and the axle 71 of the reel 7 is gravitationally gradually displaced downwardly at the use position Pu. In this way, the axle 71 of the reel 7 is guided to the discharge opening 614 by the slope parts 635, 655 with a reduction of the carrier tape TP while being supported from both sides in the feed direction Df by the slope parts 635, 633 inclined downwardly toward the discharge opening 614.

Note that the slope part 655 configured to support the axle 71 of the reel 7 from front in the feed direction Df also exhibits the following functions in addition to the function of guiding the axle 71 to the discharge opening 614 by being shaped to be inclined upwardly toward the front in the feed direction Df. That is, a force acts on the reel 7 in the feed direction Df by the tape feeder 5 pulling the carrier tape TP withdrawn from the reel 7 at the use position Pu in the feed direction Df. However, since the upwardly inclined slope part 655 is provided in the feed direction Df of the reel 7, the reel 7 rotates (revolves) at the use position Pu without moving in the feed direction Df from the use position Pu. That is, the slope part 655 exhibits a function of stably holding the reel 7 at the use position Pu regardless of a force from the tape feeder 5.

When the carrier tape TP wound on the reel 7 at the use position Pu is used up, the slope parts 635, 655 cause the axle 71 of this reel 7 to reach the discharge opening 614 (Step S33). Then, the axle 71 having reached the discharge opening 614 exits from the discharge opening 614 by its own weight and the reel 7 is discharged from the reel holder 6 (Step S34). At this time, the discharged reel 7 drops into the aforementioned reel collection container 49 (FIG. 9). If the use position Pu is emptied in this way, the reel holder 6 guides the reel 7 waiting at the standby position Pw to the use position Pu by the following function.

Figure 13:
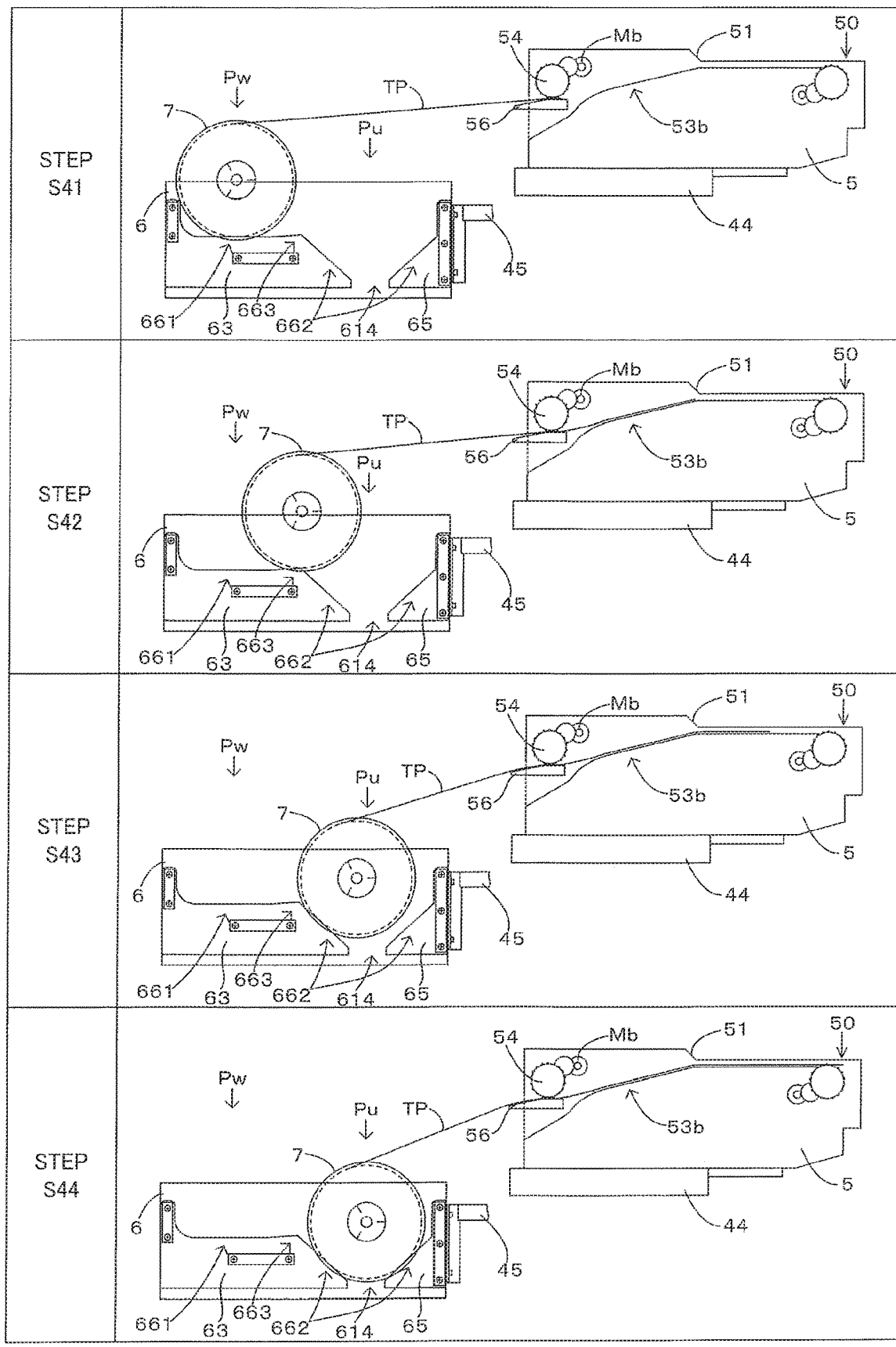
FIG. 13 is side views schematically showing a second example of the function of the reel holder.

FIG. 13 is side views schematically showing a second example of the function of the reel holder. As shown in a field of Step S41, the reel 7 on which the carrier tape TP having the tip mounted in the tape feeder 5 is wound is supported at the standby position Pw. That is, the tip of the carrier tape TP withdrawn from the reel 7 at the standby position Pw is sandwiched between the sprocket 54 of the tape feeder 5 and the tape supporting member 56.

The tape feeder 5 starts the loading described using FIG. 2 when the carrier tape TP on the reel 7 located at the use position Pu is used up. As a result, the reel 7 waiting at the standby position Pw starts moving in the feed direction Df from the standby position Pw by receiving a force in the feed direction Df applied from the tape feeder 5 via the carrier tape TP. The movement of the reel 7 in the feed direction Df is guided from the standby position Pw to the use position Pu by the reel guide part 663 fitted between the two side plates 72 of the reel 7 (Steps S42, S43). As a result, the reel 7 reaches the use position Pu at a time when or before the loading is completed (Step S44).

Incidentally, when the loading is completed, the operator removes the tape supporting member 56 from the case 52 and aligns the carrier tape TP withdrawn from the reel 7 at the use position Pu along the tape conveying path 53b. Subsequently, the operator sets a new reel 7 at the standby position Pw and sandwiches the tip of a carrier tape TP withdrawn from this reel 7 between the sprocket 54 of the tape feeder 5 and the tape supporting member 56.

As described above, in this embodiment, the reel 7 used for the component mounting being performed is supported on the use reel supporting part 662, whereas the reel 7 used for the next component mounting is supported on the standby reel supporting part 661. In addition, if a force acting toward the use reel supporting part 662 acts on the reel 7 supported on the standby reel supporting part 661, the reel 7 moving from the standby reel supporting part 661 by receiving this force is guided to the use reel supporting part 662 by the reel guide part 663. In this way, a burden of the operator required to move the reel 7 to be used next can be reduced.

Particularly in the above embodiment, the motor Mb is provided which gives the force acting toward the use reel supporting part 662 to the reel 7 supported on the standby reel supporting part 661. This enables the reel 7 to be used next to move without requiring an operation by the operator, and a burden of the operator can be more effectively reduced.

Further, the standby reel supporting part 661 is provided on a side opposite to the feeder main body 51 with respect to the use reel supporting part 662, and can support the reel 7 having the carrier tape TP having the tip attached to the feeder main body 51. The feeder main body 51 performs the loading to pull the carrier tape TP wound on the reel 7 supported on the standby reel supporting part 611 toward the component supplying position 50 by receiving a force of the motor Mb before the start of the next component mounting. At this time, the motor Mb gives a force acting toward the use reel supporting part 662 to the reel 7 supported on the standby reel supporting part 661 via the carrier tape TP pulled in by the feeder main body 51 during the loading. Thus, the motor Mb used to pull in the carrier tape TP by the feeder main body 51 is also used to move the reel 7 from the standby reel supporting part 661. This is advantageous in suppressing the number of motors Mb equipped in the component mounter 1. Further, the reel 7 can be efficiently moved from the standby reel supporting part 661 to the use reel supporting part 662 in parallel with the loading of the carrier tape TP by the feeder main body 51.

Further, the reel holder 6 discharges the reel 7 having no more carrier tape TP to the outside of the reel holder 6 from the use reel supporting part 662. This enables the previous reel 7 having no more carrier tape TP to be discharged to the outside of the reel holder 6 from the use reel supporting part 662 before the next reel 7 reaches the use reel supporting part 662 from the standby reel supporting part 661, whereby the next reel 7 can be smoothly moved to the use reel supporting part 662.

Further, the reel 7 is configured such that the two side plates 72 having a disc shape and the axle 71 between the two side plates 72 are concentrically provided, and the carrier tape TP is wound on the axle 71. In contrast, the standby reel supporting part 661 and the use reel supporting part 662 support the axle 71 of the reel 7 by being held in contact with the carrier tape TP while being fitted between the two side plates 72, and the reel guide part 663 guides the movement of the reel 7 by being held in contact with the carrier tape TP while being fitted between the two side plates 72. In such a configuration, the reel 7 can be precisely guided from the standby reel supporting part 661 to the use reel supporting part 662 by the reel guide part 663 fitted between the two side plates of the reel 7.

Next, a modification of the reel holder 6 is described. Note that the following description is centered on different parts from the reel holder 6 according to the above embodiment and common parts are denoted by corresponding reference signs and the description thereof is omitted as appropriate. However, it goes without saying that similar effects can be exhibited by having a configuration common to the above embodiment also in the following modification.

Figure 14:
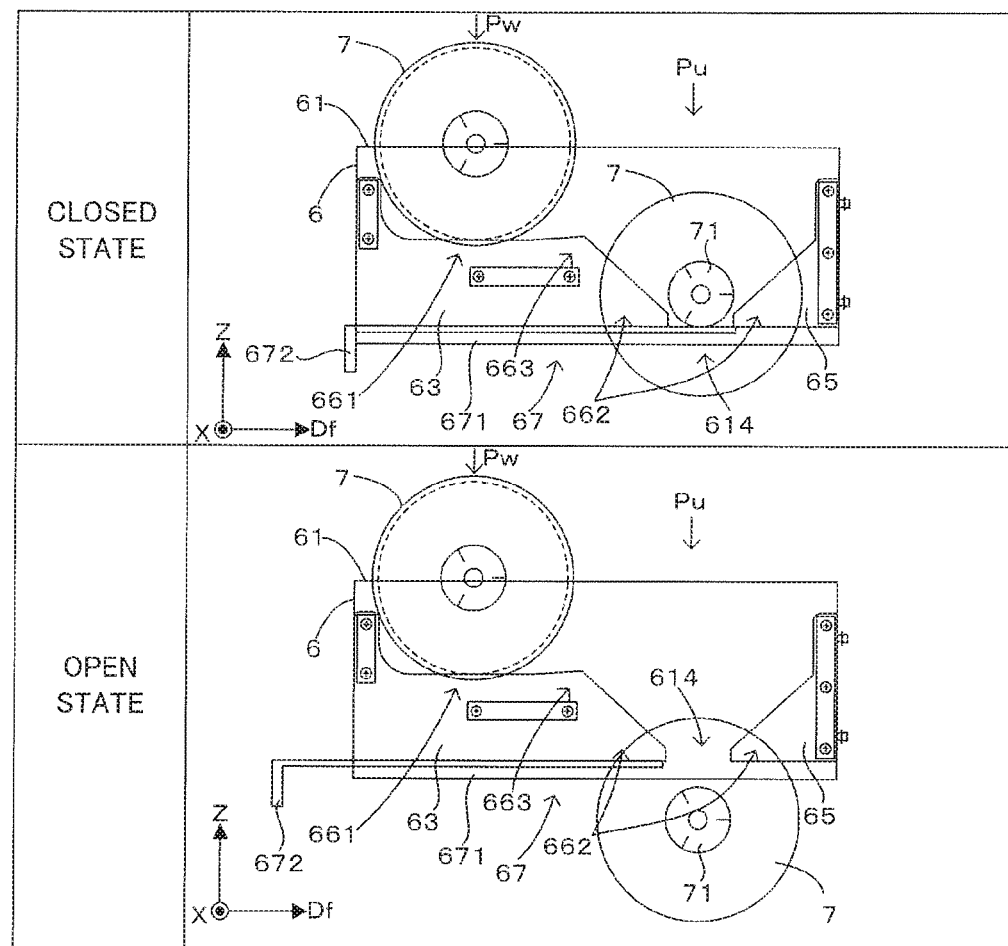
FIG. 14 is side views schematically showing a first modification of the reel holder.

FIG. 14 is side views schematically showing a first modification of the reel holder. This reel holder 6 includes a shutter member 67 provided on a bottom part of a reel supporting structure 63. This shutter member 67 includes a slide part 671 attached to the bottom part of the reel supporting structure 63 slidably in the feed direction Df and a handle 672 provided on the back end of the slide part 671 in the feed direction Df. This shutter member 67 can be selectively in a closed state where a discharge opening 614 is closed from below by the slide part 671 by being located on a front side in the feed direction Df and in an open state where the slide part 671 is removed from the discharge opening 614 to open the discharge opening 614 by being located on a back side in the feed direction Df. The exit of the axle 71 through the discharge opening 614 is regulated in the closed state, whereas the exit of the axle 71 through the discharge opening 614 is permitted in the open state. In such a configuration, an operator can adjust a discharge timing of the reel 7 from the reel holder 6 by operating the handle 672 and opening/closing the shutter member 67. Thus, for example, in the case of removing the reel collection container 49 from the feeder mounting carriage 4 to discard the reels 7 accumulated in the reel collection container 49, the discharge of the reel 7 can be regulated by closing the shutter member 67.

Figure 15:
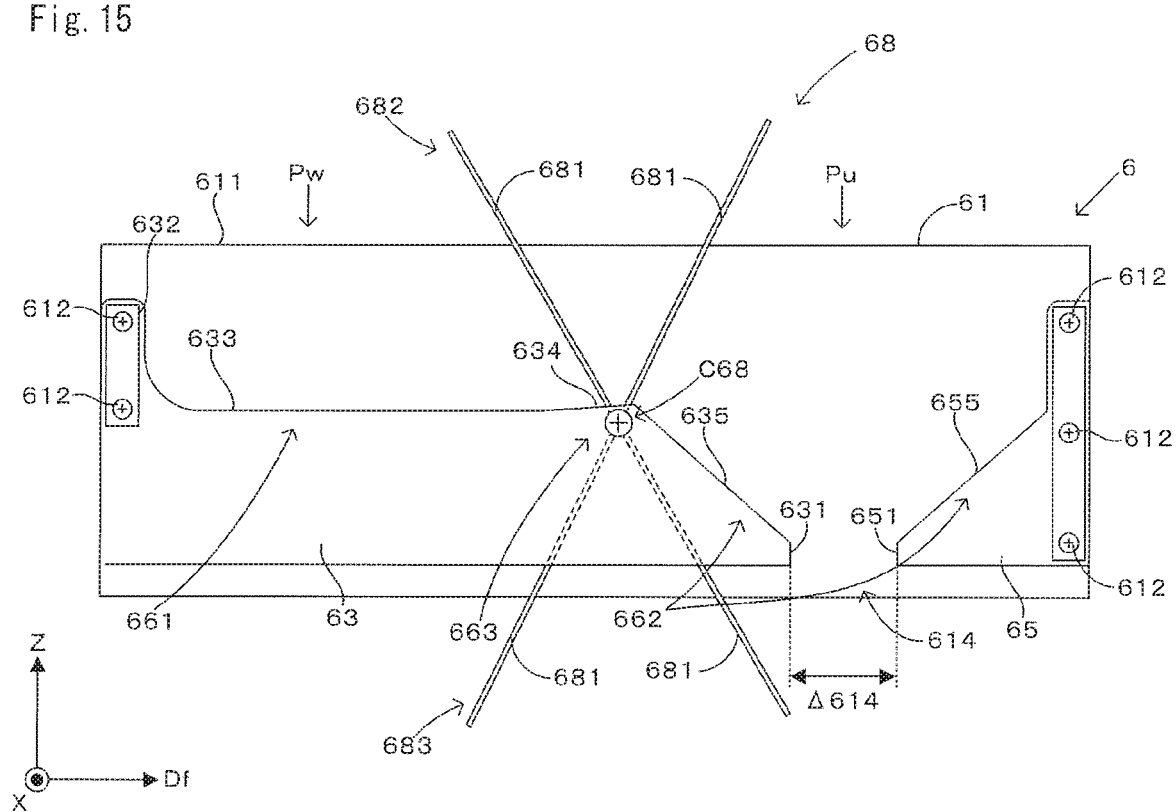
FIG. 15 is a side view schematically showing a second modification of the configuration of the reel holder with the reel removed.
Figure 16:
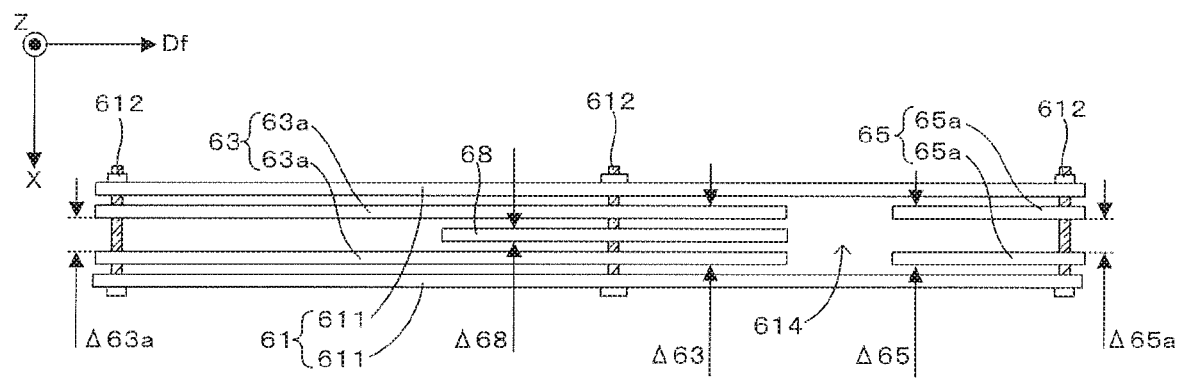
FIG. 16 is a plan view schematically showing the second modification of the configuration of the reel holder with the reel removed.
Figure 17:
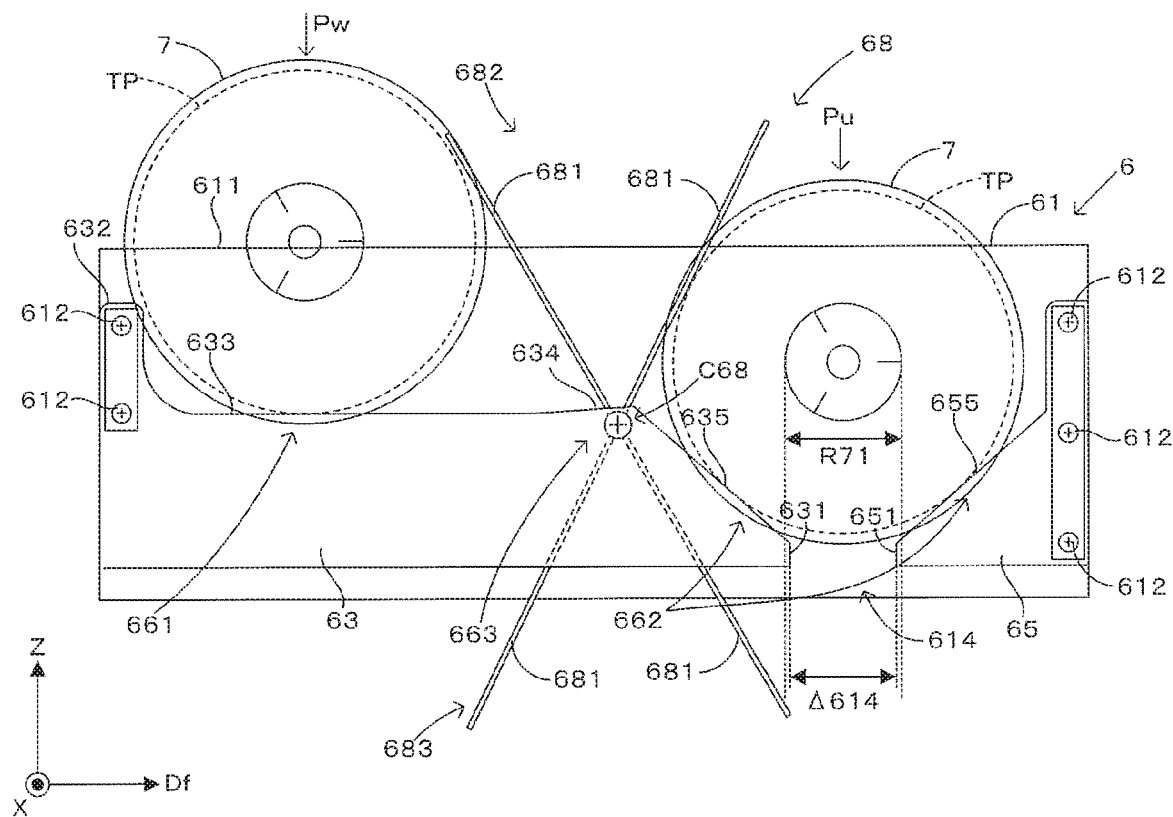
FIG. 17 is a side view schematically showing the second modification of the configuration of the reel holder with the reel set.
Figure 18:
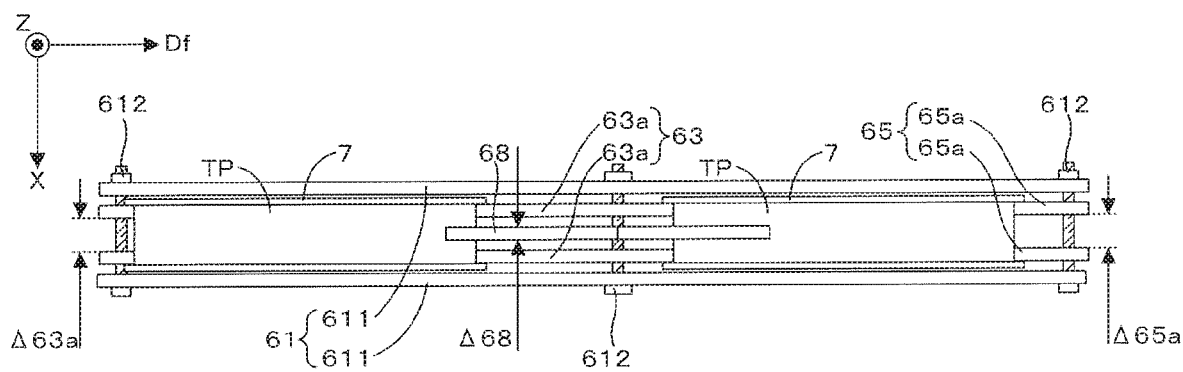
FIG. 18 is a plan view schematically showing the second modification of the configuration of the reel holder with the reel set.

FIG. 15 is a side view schematically showing a second modification of the configuration of the reel holder with the reel removed. FIG. 16 is a plan view schematically showing the second modification of the configuration of the reel holder with the reel removed. FIG. 17 is a side view schematically showing the second modification of the configuration of the reel holder with the reel set. FIG. 18 is a plan view schematically showing the second modification of the configuration of the reel holder with the reel set. Note that, in FIGS. 15 and 17, the inside of the reel holder 6 is shown through a side cover 611 on a front side.

A main difference between the second modification of the reel holder 6 and the above embodiment is that the diameter R71 of the axle 71 of the reel 7 is larger than a width Δ614 of a discharge opening 614 of the reel holder 6 in the X direction and the axle 71 of the reel 7 having no more carrier tape TP cannot exit through the discharge opening 614 by its own weight. Accordingly, the reel holder 6 according to the second modification includes a configuration for pushing out the axle 71 of the reel 7 through the discharge opening 614.

A reel supporting structure 63 of this reel holder 6 includes two supporting plates 63a arranged at an interval Δ63a in the X direction. Similarly, a reel supporting structure 65 of this reel holder 6 includes two supporting plates 65a arranged at an interval 465a (equal to 463a) in the X direction. The reel holder 6 includes an axle ejecting part 68 arranged between the two supporting plates 63a in the X direction. This axle ejecting part 68 has such an outer shape that two ejecting rods 681 intersect with each other in centers thereof and is supported by a fastening instrument 612 in an intersecting part of the two ejecting rods 681. As just described, the axle ejecting part 68 has a width Δ68 smaller than the interval Δ63a in the X direction and is mounted rotatably with respect to a body 61 between the two supporting plates 63a and between the two supporting plates 65a.

Such an axle ejecting part 68 includes a blade 682 constituted by one end parts of the two ejecting rods 681 at an acute angle on one side of a rotation center C68 and a blade 683 constituted by the other end parts of the two ejecting rods 681 at an acute angle on the other side of the rotation center C68. The rotation center C68 of the axle ejecting part 68 is located between the standby position Pw and the use position Pu in the feed direction Df. According to a rotating state of the axle ejecting part 68, either one of the blades 682, 683 projects upward from the reel supporting structure 63 and located between the standby position Pw and the use position Pu.

Figure 19:
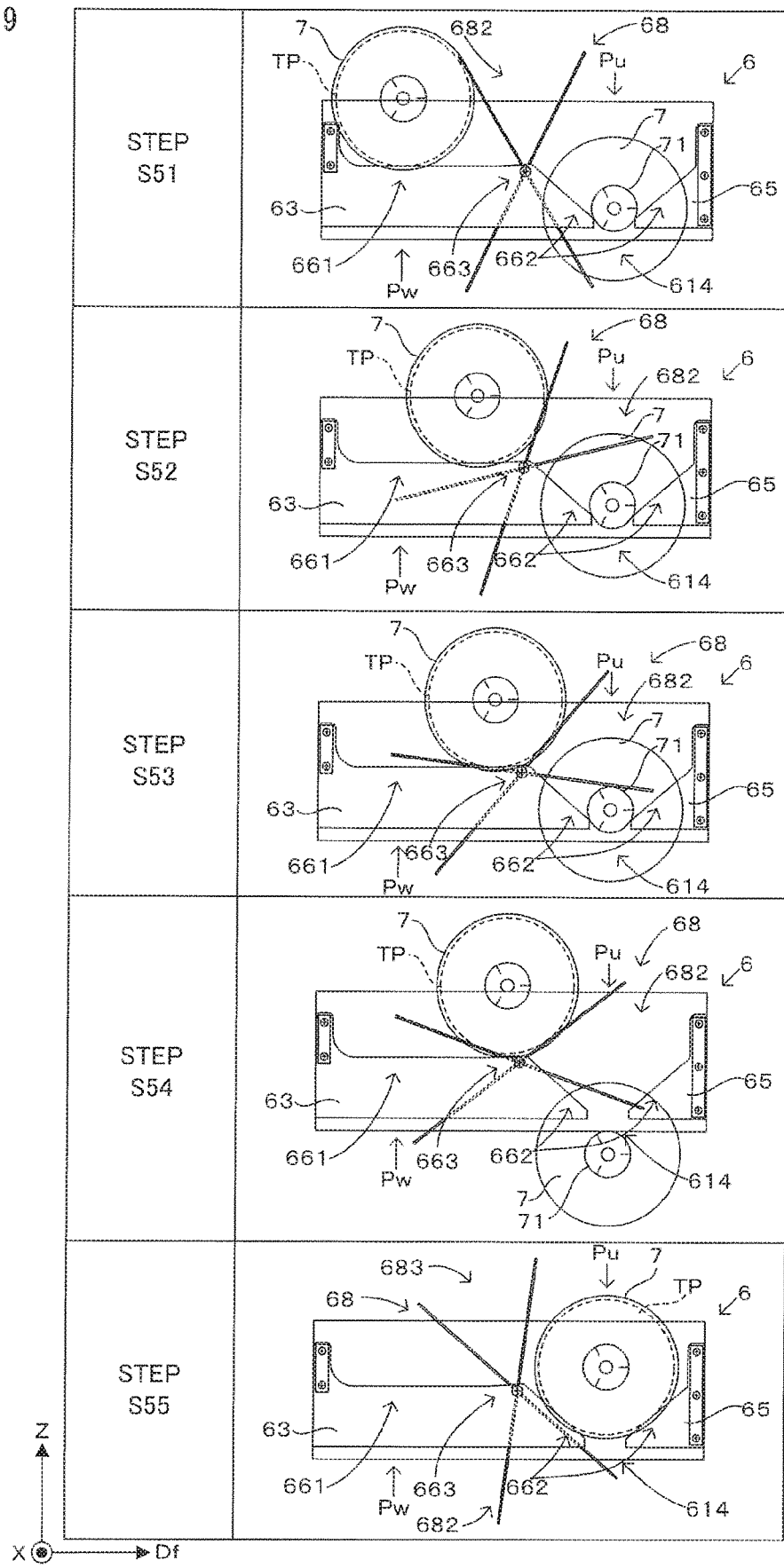
FIG. 19 is side views schematically showing the operation of the reel holder according to the second modification.

FIG. 19 is side views schematically showing the operation of the reel holder according to the second modification. Note that the carrier tape TP withdrawn from the reel 7 and moving toward the tape feeder 5 is not shown in FIG. 19. In Step S51, the carrier tape TP wound on the reel 7 at the use position Pu is used up and the axle 71 of the reel 7 at the use position Pu has reached the discharge opening 614. When the loading by the tape feeder 5 is started, the reel 7 waiting at the standby position Pw starts moving toward the use position Pu in the feed direction Df (Step S52). Further, the reel 7 moving toward the use position Pu in the feed direction Df comes into contact with the blade 682 of the reel holder 6 from behind in the feed direction Df to rotate the blade 682 in the feed direction Df. As a result, the blade 682 comes into contact with the axle 71 of the reel 7 having reached the discharge opening 614 from above (Step S53). Further, the reel 7 pulled out from the tape feeder 5 and moving in the feed direction Df further rotates the blade 682, and the axle 71 of the reel 7 is pushed out through the discharge opening 614 by the blade 682 (Step S54). At this time, the axle 71 exits through the discharge opening 614 as at least one of the axle 71 of the reel 7, a front end 631 and a rear end 651 of the reel supporting structures 63, 65 specifying the discharge opening 614 is deformed. Then, a new reel 7 having a carrier tape TP fully wound thereon reaches the use position Pu (Step S55).

As just described, the reel holder 6 includes the axle ejecting part 68 configured to discharge the reel 7 having no more carrier tape TP to the outside of the reel holder 6 from a use reel supporting part 662. This enables the previous reel 7 having no more carrier tape TP to be discharged to the outside of the reel holder 6 from the use reel supporting part 662 before the next reel 7 reaches from a standby reel supporting part 661 to the use reel supporting part 662, whereby the next reel 7 can be smoothly moved to the use reel supporting part 662.

Further, in the reel holder 6, the discharge opening 614 facing the reel 7 supported on the use reel supporting part 662 is provided and the axle ejecting part 68 pushes out the reel 7 having no more carrier tape TP from the use reel supporting part 662 via the discharge opening 614 by transmitting a force acting on the reel 7 supported on the standby reel supporting part 661 to the reel 7 supported on the use reel supporting part 662. This enables the previous reel 7 having no more carrier tape TP to be discharged from the use reel supporting part 662 as the next reel 7 moves from the standby reel supporting part 661 to the use reel supporting part 662, whereby the next reel 7 can be smoothly moved to the use reel supporting part 662.

Incidentally, in the second modification, the axle ejecting part 68 is rotated, utilizing a force of the motor Mb of the tape feeder 5 to pull the carrier tape TP during the loading. However, a motor configured to rotate the axle ejecting part 68 may be provided separately from the motor Mb.

Figure 20:
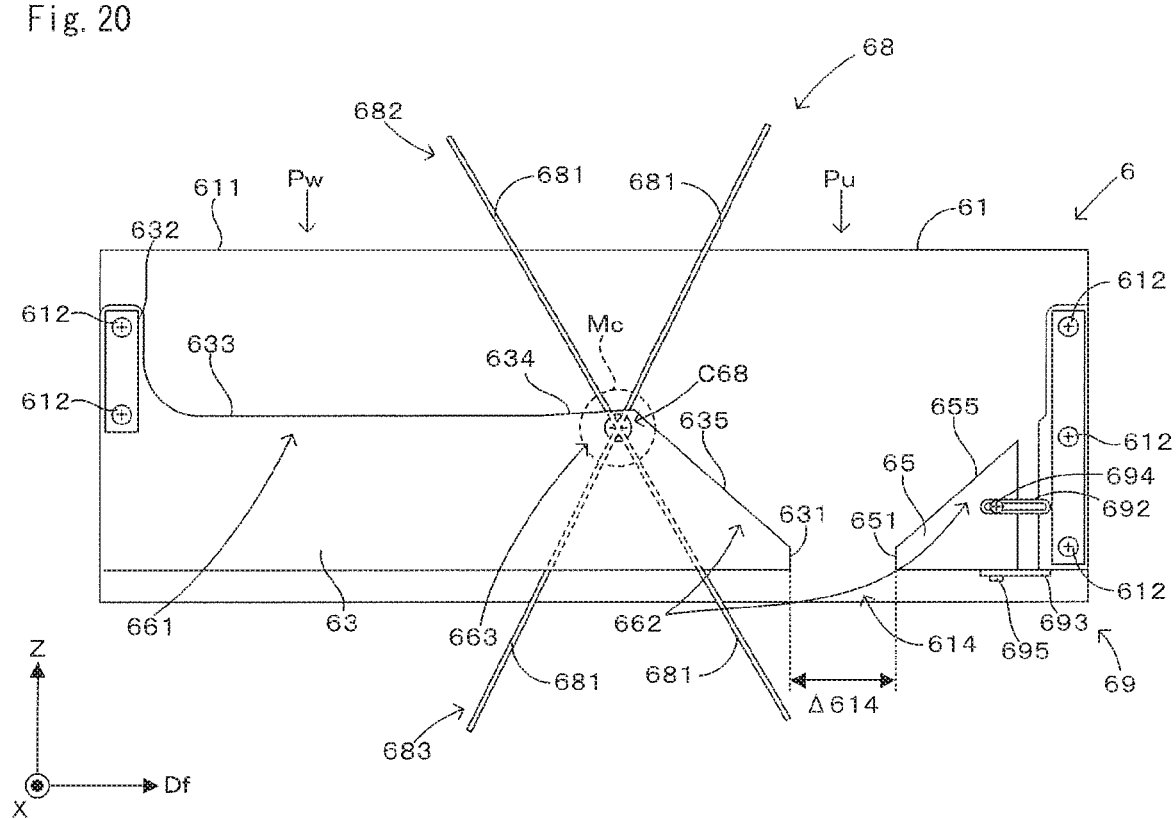
FIG. 20 is a side view schematically showing a third modification of the reel holder with the reel removed.

FIG. 20 is a side view schematically showing a third modification of the reel holder with the reel removed. This reel holder 6 includes a motor Mc configured to rotate an axle ejecting part 68. Thus, the reel holder 6 can push out the axle 71 of the reel 7 through a discharge opening 614 by the axle ejecting part 68 by rotating the axle ejecting part 68 in a forward direction (clockwise direction of FIG. 20) by a drive force of the motor Mc.

Incidentally, the reel 7 is possibly jammed in a body 61 while moving from a standby reel supporting part 661 to a use reel supporting part 662. In this case, the reel holder 6 returns the reel 7 toward the standby reel supporting part 661 by rotating the axle ejecting part 68 in an opposite direction (counterclockwise direction of FIG. 20) by a drive force of the motor Mc. In this way, the jamming of the reel 7 in the body 61 can be solved. Note that the jamming of the reel 7 in the body 61 can be judged, for example, by detecting an increase of a load acting on the motor Mc.

Further, this reel holder 6 includes a configuration for adjusting a width Δ614 of the discharge opening 614 in the feed direction Df. That is, this reel holder 6 includes a supporting mechanism 69 configured to support a reel supporting structure 65 on a front end in the feed direction Df. This supporting mechanism 69 includes a base frame 691 fixed to the front end of the body 61 in the feed direction Df by fastening instruments 612 and extending in the Z direction and two guide frames 692, 693 extending backward in the feed direction Df from the base frame 691. Guide grooves extending in the feed direction Df penetrate through these guide frames 692, 693, the guide frame 692 supports the reel supporting structure 65 in the X direction and the guide frame 693 supports the reel supporting structure 65 from below. Further, the supporting mechanism 69 includes a screw 694 to be inserted into the guide groove of the guide frame 692 and threadably engaged with a side surface of the reel supporting structure 65 and a screw 695 to be inserted into the guide groove of the guide frame 693 and threadably engaged with a bottom surface of the reel supporting structure 65.

Accordingly, the operator can move the position of the reel supporting structure 65 in the feed direction Df with the screws 694, 695 loosened. Further, the reel supporting structure 65 can be fixed to the guide frames 692, 693 by screwing the screws 694, 695 into the reel supporting structure 65. That is, the width 4614 of the discharge opening 614 in the feed direction Df can be adjusted by adjusting the position of the reel supporting structure 65 in the feed direction Df. This enables various reels 7 having different diameters R71 (outer diameters) of axles 71 to be properly held and discharged.

Particularly, the width Δ614 of the discharge opening 614 can be adjusted by moving the reel supporting structure 65 out of the two reel supporting structures 63, 65 arranged across the discharge opening 614. Thus, the width Δ614 of the discharge opening 614 can be adjusted by a simple operation of moving the reel supporting structure 65. Note that although the width Δ614 of the discharge opening 614 is adjusted by a movement of the reel supporting structure 65 here, the width Δ614 of the discharge opening 614 may be adjusted by a movement of the reel supporting structure 63 or by a movement of each of the reel supporting structures 63, 65.

Figure 21:
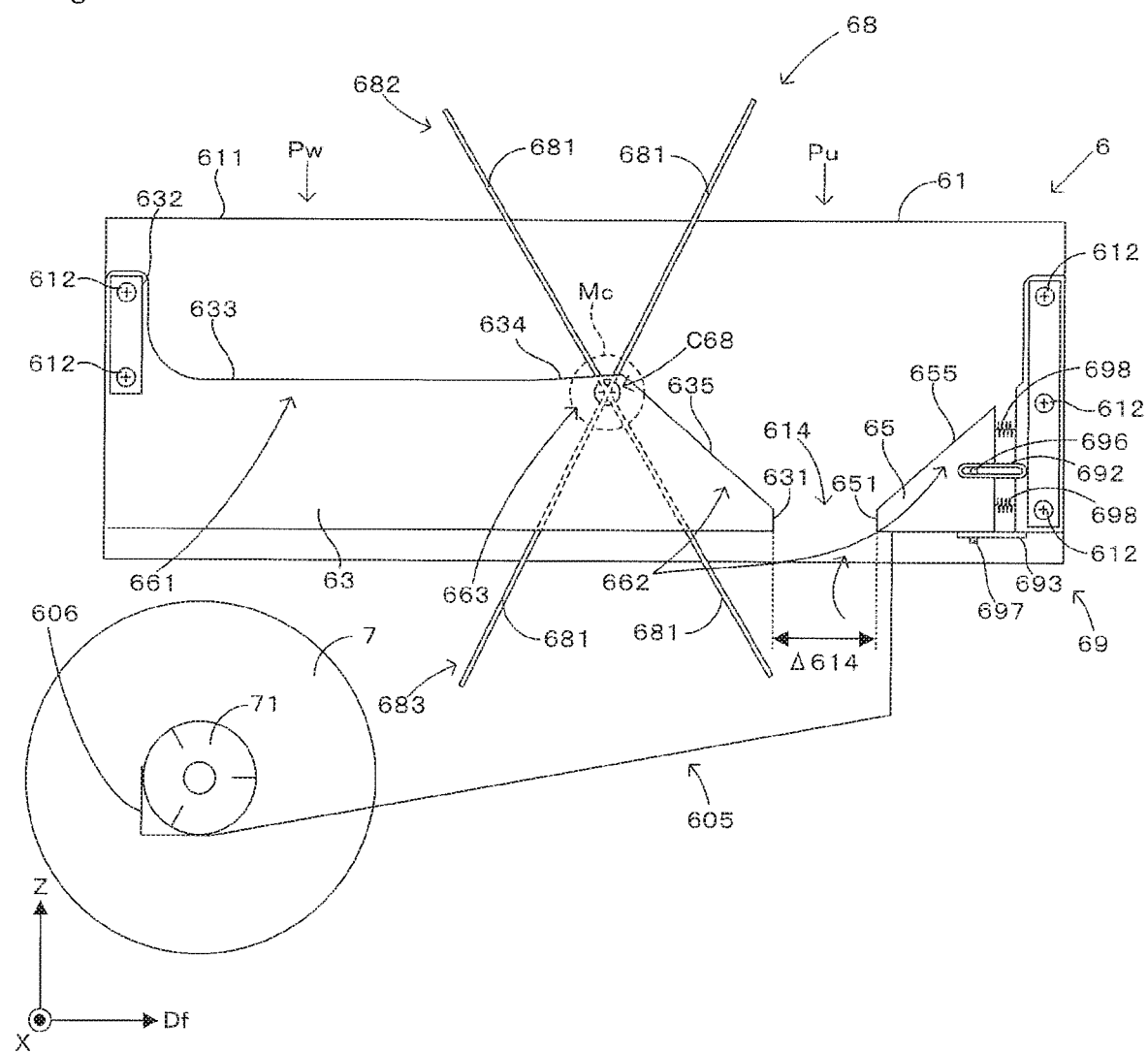
FIG. 21 is a side view schematically showing a fourth modification of the reel holder with the reel removed.

FIG. 21 is a side view schematically showing a fourth modification of the reel holder with the reel removed. Not the aforementioned screws 694, 695, but pins 696, 697 projecting from a reel supporting structure 65 are fitted into guide grooves of guide frames 692, 693 of a supporting mechanism 69 of this reel holder 6. Compressed springs 698 are provided between the reel supporting structure 65 supported by the guide frames 692, 693 and a base frame 691, and the reel supporting structure 65 is biased backward in the feed direction Df by the compressed springs 698.

In this reel holder 6, an axle ejecting part 68 held in contact with the axle 71 of the reel 7 having reached a discharge opening 614 from above pushes the axle 71 downwardly against biasing forces of the compressed springs 698 by receiving a drive force from a motor Mc and rotating. As a result, the axle 71 exits through the discharge opening 614 while pushing the reel supporting structure 65 forward in the feed direction Df and widening the discharge opening 614 in the feed direction Df. Note that the supporting mechanism 69 shown in the third and fourth modifications of FIGS. 20 and 21 is also applicable, for example, to the reel holder 6 according to the second modification.

Further, this reel holder 6 includes a reel receiving member 605 configured to receive the axle 71 of the reel 7 discharged through the discharge opening 614. The reel receiving member 605 extends obliquely downward toward the back from the front side of the discharge opening 614 in the feed direction Df, receives the axle 71 dropped from the discharge opening 614 and holds the axle 71 by a click standing on a rear end. In the case of using such a reel holder 6, the reel 7 discharged from the reel holder 6 is held in the reel receiving member 605, wherefore the reel collection container 49 may not be provided.

Figure 22:
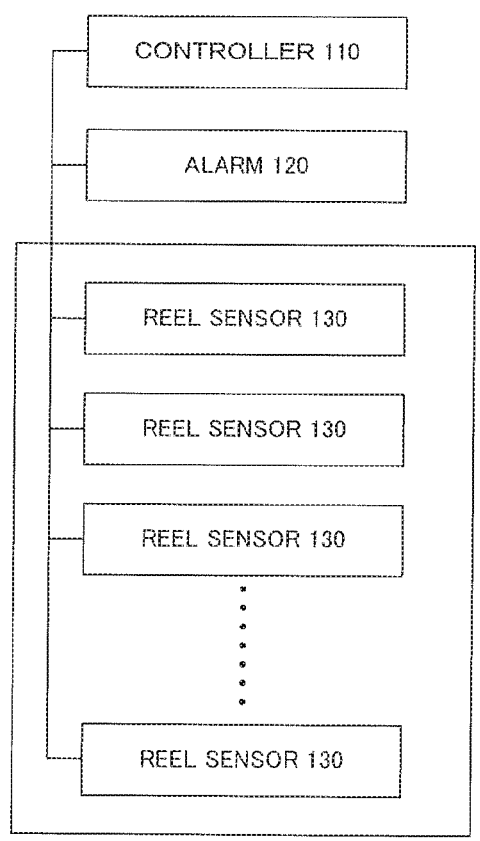
FIG. 22 is a block diagram showing an example of the electrical configuration of the component mounter.

FIG. 22 is a block diagram showing an example of the electrical configuration of the component mounter. This component mounter 1 includes a controller 110 configured by a CPU (Central Processing Unit) and a RAM (Random Access Memory) and an alarm 120 configured to notify a predetermined content to the operator. An alarm for notification to the operator, for example, by a buzzer sound or a warning light, an alarm for displaying a predetermined content to the operator such as a display or the like can be used as the alarm 120. Further, the component mounter 1 includes reel sensors 130 configured to detect the presence or absence of the reel 7 at the standby position Pw for each of the plurality of reel holders 6.

This controller 110 monitors an output of each reel sensor 130. If any one of the reel sensors 130 detects the absence of the reel 7 at the standby position Pw, the controller 110 causes the alarm 120 to issue a reel set request for requesting the operator to set a new reel 7 at the standby position Pw of the reel holder 6 for which the absence of the reel 7 has been detected. In this way, when the standby position Pw is emptied according to a movement from the standby position Pw to the use position Pu, the operator can quickly set the reel 7 at the standby position Pw in response to the reel set request.

Further, the controller 110 confirms by the reel sensor 130 whether or not the reel 7 has been set at the standby position Pw of the reel holder 6 for which the reel set request has been issued. In this way, it can be confirmed whether or not the reel 7 has been correctly set in the reel holding device for which the reel set request has been issued, out of the plurality of reel holders 6.

As just described, in this embodiment, the carrier tape TP corresponds to an example of a "carrier tape" of the disclosure, the reel 7 corresponds to an example of a "reel" of the disclosure, the side plate 72 corresponds to an example of a "side plate" of the disclosure, the axle 71 corresponds to an example of an "axle" of the disclosure, the reel holder 6 corresponds to an example of a "reel holding device" of the disclosure, the component supplying position 50 corresponds to an example of a "component supplying position" of the disclosure, the feeder main body 51 corresponds to an example of a "tape supplying part" of the disclosure, the board S corresponds to an example of a "board" of the disclosure, the mounting head 31 corresponds to an example of a "mounting head" of the disclosure, the use reel supporting part 662 corresponds to an example of a "first reel supporting part" of the disclosure, the standby reel supporting part 661 corresponds to an example of a "second reel supporting part" of the disclosure, the reel guide part 663 corresponds to an example of a "reel guide part" of the disclosure, the component mounter 1 corresponds to an example of a "component mounter" of the disclosure, the motor Mb corresponds to an example of a "drive source" of the disclosure, the axle ejecting part 68 corresponds to an example of a "reel discharging part", a "rotational pushing member" and a "reel reverse feeding part" of the disclosure, the discharge opening 614 corresponds to an example of a "discharge opening" of the disclosure, the reel holder attaching part 45 corresponds to an example of a "holding device supporting part" of the disclosure, the reel sensor 130 corresponds to an example of a "detector" of the disclosure, the alarm 120 corresponds to an example of an "alarm" of the disclosure, and the controller 110 corresponds to an example of a "controller" of the disclosure.

Note that the disclosure is not limited to the above embodiment and various changes can be made on the above embodiment without departing from the gist of the disclosure. For example, in the above embodiment, the reel 7 is moved from the standby reel supporting part 661 to the use reel supporting part 662 by the drive force generated by the motor Mb of the tape feeder 5. However, separately from such a motor Mb, a cylinder may be provided which pushes out the reel 7 on the standby reel supporting part 661 from behind in the feed direction Df and the reel 7 may be moved by a drive force generated by this cylinder. Alternatively, the reel 7 may be manually moved by the operator. Even in this case, the operator can move the reel 7 by a simple operation of pushing the reel 7 supported on the standby reel supporting part 661 toward the use reel supporting part 662. In this way, a burden of the operator required to move the reel 7 to be used next can be reduced.

Further, in the above embodiment, the operator sets the reel 7 at the standby position Pw. However, the component mounter 1 may be equipped with a reel supplying device configured to automatically set the reel 7 at the standby position Pw.

The specific configuration of the reel 7 can be variously changed. Accordingly, it is possible, for example, to use a reel 7 having side plates 72 with holes for a weight reduction or the like.

Further, the specific configuration of the tape feeder 5 can also be changed as appropriate. Accordingly, a component supplying device described in JP2015-159142A may be, for example, used as the tape feeder 5.

Further, the discharge opening 614 is provided in the bottom part of the reel holder 6. However, the position of the discharge opening 614 is not limited to this. Accordingly, a discharge opening 614 open in the feed direction Df may be provided in the front end of the reel holder 6. In this case, the slope part 635 of the reel supporting structure 63 may be extended to the discharge opening 614 in the front end of the body 61 while the reel supporting structure 65 is omitted. In this way, the axle 71 of the reel 7 can be guided to the discharge opening 614 by the slope part 635 inclined downwardly toward the discharge opening 614 as the carrier tape TP decreases.

Figure 23:
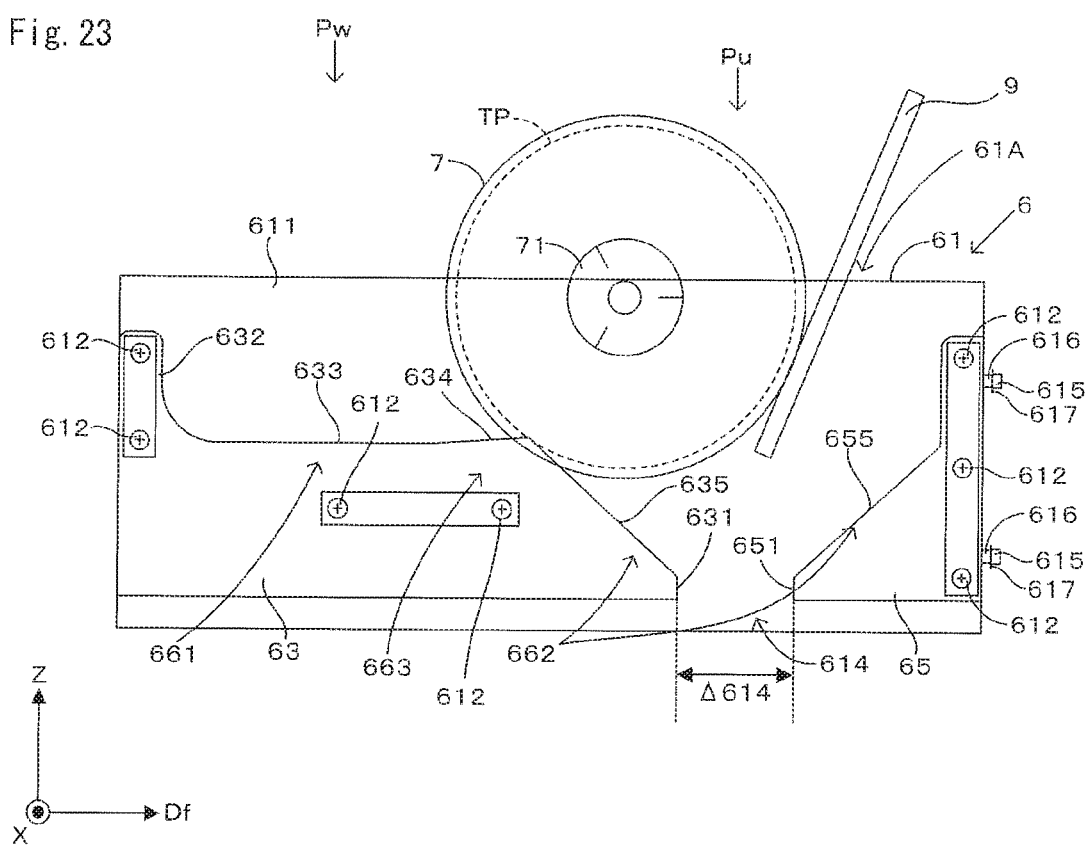
FIG. 23 is a side view schematically showing an example of the operation when the reel is jammed in the reel holder.

Further, the body 61 of the reel holder 6 includes the opening 61A open upward. Thus, if the reel 7 is jammed in the body 61, for example, while moving from the standby reel supporting part 661 toward the use reel supporting part 662, an operation as shown in FIG. 23 can be performed by the operator. FIG. 23 is a side view schematically showing an example of the operation when the reel is jammed in the reel holder. As shown in FIG. 23, the operator can solve the jamming of the reel 7 in the body 61 by accessing the reel 7 jammed in the body 61 and pushing out the reel 7 by a rod-like tool 9 inserted via the opening 61A (insertion opening).

As the specific embodiment has been illustrated and described above, the disclosure can be, for example, configured as follows.

The component mounter may be configured to further comprise a drive source configured to give the force acting toward the first reel supporting part to the reel supported on the second reel supporting part. In this way, the reel to be used next can be moved without requiring an operation by the operator, and a burden of the operator can be more effectively reduced.

The component mounter may be configured so that the drive source gives the force acting toward the first reel supporting part to the reel supported on the second reel supporting part via the carrier tape. In such a configuration, the drive source used to pull in the carrier tape by the tape supplying part can be used also to move the reel from the second reel supporting part, which is advantageous in suppressing the number of drive sources equipped in the component mounter.

The component mounter may be configured so that the second reel supporting part is provided on a side opposite to the tape supplying part with respect to the first reel supporting part and configured to support the reel with a tip of the carrier tape mounted in the tape supplying part; the tape supplying part performs loading of pulling in the carrier tape wound on the reel supported on the second reel supporting part toward the component supplying position by a force of the drive source before the start of the next component mounting; and the drive source gives the force acting toward the first reel supporting part to the reel supported on the second reel supporting part via the carrier tape pulled in by the tape supplying part during the loading. In such a configuration, the drive source used to pull in the carrier tape by the tape supplying part can be used also to move the reel from the second reel supporting part, which is advantageous in suppressing the number of drive sources equipped in the component mounter. Further, the reel can be efficiently moved from the second reel supporting part to the first reel supporting part in parallel with the loading of the carrier tape by the tape supplying part.

The component mounter may be configured so that the reel holding device further includes a reel discharging part configured to discharge the reel having no more carrier tape from the first reel supporting part to outside of the reel holding device. In this way, the previous reel having no more carrier tape can be discharged from the first reel supporting part to the outside of the reel holding device before the next reel reaches from the second reel supporting part to the first reel supporting part, whereby the next reel can be smoothly moved to the first reel supporting part.

The component mounter may be configured so that a discharge opening facing the reel supported on the first reel supporting part is provided in the reel holding device; and the reel discharging part pushes out the reel having no more carrier tape from the first supporting part via the discharge opening by transmitting a force acting on the reel supported on the second reel supporting part to the reel supported on the first reel supporting part. In this way, the previous reel having no more carrier tape can be discharged from the first supporting part as the next reel moves from the second supporting part to the first supporting part, whereby the next reel can be smoothly moved to the first reel supporting part.

Specifically, the component mounter may be configured so that the reel discharging part includes a rotational pushing member configured to rotate from the second reel supporting part toward the first reel supporting part between the second reel supporting part and the first reel supporting part; and the rotational pushing member pushes out the reel having no more carrier tape from the first reel supporting part via the discharge opening by being pushed to rotate by the reel moving from the second reel supporting part to the first reel supporting part.

The component mounter may be configured so that further comprised is a holding device supporting part configured to support the reel holding device with respect to the tape supplying part, and the reel holding device is removably attachable to the holding device supporting part.

The component mounter may further comprises: a detector configured to detect the presence or absence of the reel on the second reel supporting part; an alarm configured to issuer a reel set request to request an operator to set the reel on the second reel supporting part; and a controller for causing the alarm to issue the reel set request when the absence of the reel on the second reel supporting part is detected by the detector. In such a configuration, when the second supporting part is emptied as the reel moves from the second supporting part to the first supporting part, the operator can quickly set the reel on the second supporting part in response to the reel set request.

The component mounter may be configured so that the detector detects the presence or absence of the reel on the second reel supporting part for each of a plurality of reel holding devices; and the controller causes the detector to confirm whether or not the reel has been set on the second reel supporting part of the reel holding device, for which the reel set request has been issued, after causing the alarm to issue the reel set request for the reel holding device in which the absence of the reel on the second reel supporting part has been confirmed by the detector. In this way, it can be confirmed whether or not the reel has been properly set in the reel holding device for which the reel set request has been issued, out of the plurality of reel holding devices.

The component mounter may be configured so that the reel holding device further includes a reel reverse feeding part configured to return the reel jammed in the reel holding device during a movement from the second reel supporting part to the first reel supporting part toward the second reel supporting part. In such a configuration, the jamming of the reel in the reel holding device can be solved by returning the reel to the second reel supporting part by the reel reverse feeding part.

The component mounter may be configured so that the reel holding device includes an insertion opening through which a tool is insertable, and the reel jammed in the reel holding device during a movement from the second reel supporting part to the first reel supporting part is capable of being pushed out by the tool inserted via the insertion opening. In such a configuration, the operator can solve the jamming of the reel in the reel holding device by pushing out the reel using the tool inserted via the insertion opening.

The component mounter may be configured so that the reel is configured such that two side plates having a disc shape and an axle between the two side plates are concentrically provided, and the carrier tape is wound on the axle; the first reel supporting part and the second reel supporting part support the axle of the reel by being held in contact with the carrier tape while being fitted between the two side plates; and the reel guide part guides a movement of the reel by being held in contact with the carrier tape while being fitted between the two side plates. In such a configuration, the reel can be precisely guided from the second reel supporting part to the first reel supporting part by the reel guide part fitted between the two side plates of the reel.

What is claimed is:

1. A component mounter, comprising:
a reel holder configured to hold a reel on which a carrier tape accommodating components is wound;
a tape supplier configured to feed the carrier tape withdrawn from the reel held by the reel holder to a predetermined component supplying position; and
a mounting head configured to perform component mounting of taking out the component supplied to the component supplying position by the tape supplier from the carrier tape and mounting the component on a board;
the reel holder including:
a first reel support configured to support the reel on which the carrier tape, withdrawn by the tape supplier in a component mounting being performed, is wound;
a second reel support configured to support the reel on which the carrier tape, planned to be withdrawn by the tape supplier in a next component mounting, is wound; and
a reel guide configured to guide the reel moving from the second reel support to the first reel support by receiving a force acting toward the first reel support when the force acts on the reel supported on the second reel support,
wherein the reel guide is located between the first reel support and the second reel support.

2. The component mounter according to claim 1, further comprising:
a drive source configured to provide the force acting toward the first reel support to the reel supported on the second reel support; and
a sprocket,
wherein the sprocket engages the carrier tape wound on the reel supported by the second reel support, and
the drive source makes the sprocket rotate to provide the force to the carrier tape.

3. The component mounter according to claim 2, wherein:
the second reel support is provided on a side opposite to the tape supplier with respect to the first reel support and configured to support the reel with a tip of the carrier tape mounted in the tape supplier;
the tape supplier performs loading of pulling in the carrier tape wound on the reel supported on the second reel support toward the component supplying position by a force of the drive source before the start of the next component mounting, the drive source making the sprocket engaging with the carrier tape rotate to give the force during loading; and
the drive source gives the force acting toward the first reel support to the reel supported on the second reel support via the carrier tape pulled in by the tape supplier during the loading.

4. The component mounter according to claim 3, wherein the reel holder further includes a reel discharger that includes a discharge opening and discharges the reel having no more carrier tape from the first reel support to outside of the reel holder via the discharge opening.

5. The component mounter according to claim 2, wherein:
the second reel support is provided on a side opposite to the tape supplier with respect to the first reel support and supports the reel with a tip of the carrier tape mounted in the tape supplier;
the tape supplier performs loading of pulling in the carrier tape wound on the reel supported on the second reel support toward the component supplying position by a force of the drive source before the start of the next component mounting, the drive source making the sprocket engaging with the carrier tape rotate to give the force during loading; and
the drive source gives the force acting toward the first reel support to the reel supported on the second reel support via the carrier tape pulled in by the tape supplier during the loading.

6. The component mounter according to claim 2, wherein the reel holder further includes a reel discharger that includes a discharge opening and discharges the reel having no more carrier tape from the first reel support to outside of the reel holder via the discharge opening.

7. The component mounter according to claim 2, further comprising a holder support that includes a reel holder attaching part to support the reel holder attached to the reel holder attaching part with respect to the tape supplier, wherein:
the reel holder is removably attachable to the holder support.

8. The component mounter according to claim 2, further comprising a holder support configured to support the reel holder with respect to the tape supplier, wherein:
the reel holder is removably attachable to the holder support.

9. The component mounter according to claim 1, wherein the reel holder further includes a reel discharger configured to discharge the reel having no more carrier tape from the first reel support to outside of the reel holder;
a discharge opening facing the reel supported on the first reel support is provided in the reel holder;
the reel discharger pushes out the reel having no more carrier tape from the first reel support via the discharge opening by transmitting a force acting on the reel supported on the second reel support to the reel supported on the first reel support;
the reel discharger includes a rotational pushing member configured to rotate from the second reel support toward the first reel support between the second reel support and the first reel support; and
the rotational pushing member pushes out the reel having no more carrier tape from the first reel support via the discharge opening by being pushed to rotate by the reel moving from the second reel support to the first reel support.

10. The component mounter according to claim 1, further comprising a holder support configured to support the reel holder with respect to the tape supplier, wherein:
the reel holder is removably attachable to the holder support.

11. The component mounter according to claim 1, further comprising:
a detector configured to detect the presence or absence of the reel on the second reel support;
an alarm configured to issuer a reel set request to request an operator to set the reel on the second reel support;
a controller configured to control the alarm to issue the reel set request when the absence of the reel on the second reel support is detected by the detector; and
a reel sensor for the reel holder,
wherein the controller is connected with the alarm and the reel sensor.

12. The component mounter according to claim 11, wherein:
the detector detects the presence or absence of the reel on the second reel support for each of a plurality of reel holders; and
the controller controls the detector to confirm whether or not the reel has been set on the second reel support of the reel holder, for which the reel set request has been issued, after causing the alarm to issue the reel set request for the reel holder in which the absence of the reel on the second reel support has been confirmed by the detector.

13. The component mounter according to claim 1, wherein the reel holder further includes a reel reverse feeder configured to return the reel jammed in the reel holder during a movement from the second reel support to the first reel support toward the second reel support.

14. The component mounter according to claim 1, wherein the reel holder includes an insertion opening through which a tool is insertable, and the reel jammed in the reel holder during a movement from the second reel support to the first reel support is capable of being pushed out by the tool inserted via the insertion opening.

15. The component mounter according to claim 1, wherein:
the reel is configured such that two side plates having a disc shape and an axle between the two side plates are concentrically provided, and the carrier tape is wound on the axle;

the first reel support and the second reel support support the axle of the reel by being held in contact with the carrier tape while being fitted between the two side plates; and the reel guide guides a movement of the reel by being held in contact with the carrier tape while being fitted between the two side plates.

16. A component mounter, comprising:

a reel holder configured to hold a reel on which a carrier tape accommodating components is wound;

a tape supplier configured to feed the carrier tape withdrawn from the reel held by the reel holder to a predetermined component supplying position; and a mounting head configured to perform component mounting of taking out the component supplied to the component supplying position by the tape supplier from the carrier tape and mounting the component on a board;

the reel holder including:
  a first reel support configured to support the reel on which the carrier tape, withdrawn by the tape supplier in a component mounting being performed, is wound;
  a second reel support configured to support the reel on which the carrier tape, planned to be withdrawn by the tape supplier in a next component mounting, is wound; and
  a reel guide configured to guide the reel moving from the second reel support to the first reel support by receiving a force acting toward the first reel support when the force acts on the reel supported on the second reel support, wherein the reel guide is located between the first reel support and the second reel support, and the reel guide fits between two side plates of the reel to guide the reel from the second reel support to the first reel support.

* * * * *